(12) United States Patent
Kang et al.

(10) Patent No.: US 9,674,957 B2
(45) Date of Patent: Jun. 6, 2017

(54) DISPLAY DEVICE AND METHOD OF MANUFACTURING THE SAME

(71) Applicant: Samsung Display Co., Ltd., Yongin (KR)

(72) Inventors: Hyun-Ho Kang, Ansan-si (KR); Hyungjune Kim, Anyang-si (KR); Osung Seo, Seoul (KR); Taekyung Yim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 159 days.

(21) Appl. No.: 14/612,506

(22) Filed: Feb. 3, 2015

(65) Prior Publication Data

US 2015/0223359 A1     Aug. 6, 2015

(30) Foreign Application Priority Data

Feb. 4, 2014   (KR) .................. 10-2014-0012718
Jun. 2, 2014   (KR) .................. 10-2014-0067099

(51) Int. Cl.
*H05K 1/14*     (2006.01)
*G02F 1/1333*   (2006.01)

(52) U.S. Cl.
CPC ......... *H05K 1/14* (2013.01); *G02F 1/133308* (2013.01); *G02F 2001/133311* (2013.01); *G02F 2001/133317* (2013.01); *G02F 2201/501* (2013.01); *G02F 2201/503* (2013.01)

(58) Field of Classification Search
CPC ............... H05K 1/14; G02F 1/133308; G02F 2001/133311; G02F 2201/503; G02F 2001/133317; G02F 2201/501
See application file for complete search history.

(56) References Cited

U.S. PATENT DOCUMENTS

| | | | |
|---|---|---|---|
| 6,831,727 B2 * | 12/2004 | Akiyama | .......... G02F 1/133305 257/59 |
| 7,675,602 B2 | 3/2010 | Yamanaka | |
| 7,772,770 B2 * | 8/2010 | Kim | .................... G02F 1/13452 313/504 |
| 8,456,586 B2 | 6/2013 | Mathew et al. | |
| 8,470,613 B2 | 6/2013 | von Kaenel | |
| 8,508,706 B2 * | 8/2013 | Minami | .................. H01J 9/261 349/153 |

(Continued)

FOREIGN PATENT DOCUMENTS

JP        2000-147470      5/2000
KR     10-2004-0017693     2/2004

(Continued)

*Primary Examiner* — Nathan Milakovich
(74) *Attorney, Agent, or Firm* — H.C. Park & Associates, PLC

(57) ABSTRACT

A display device includes a first supporting member disposed in the first pad area of the first base substrate and spaced apart from the sealing member to define a predetermined space. A second supporting member is filled in the predetermined space by filling and curing liquid material. This protects the display panel from harsh ambience, such as light, heat and moistures, reducing the sealing and black matrix area. Such improvement can decrease the bezel size, effectively increasing viewable area of the display, which becomes more important in the mobile device.

18 Claims, 18 Drawing Sheets

(56) References Cited

U.S. PATENT DOCUMENTS

| | | | | |
|---|---|---|---|---|
| 8,786,820 B2* | 7/2014 | Wu | ............... | G02F 1/1339 349/150 |
| 8,816,212 B2* | 8/2014 | Hu | ............... | G02F 1/13452 174/254 |
| 9,466,646 B2* | 10/2016 | Kim | ............... | H01L 27/323 |
| 2006/0197902 A1* | 9/2006 | Cho | ............... | G02F 1/13394 349/153 |
| 2007/0013822 A1* | 1/2007 | Kawata | ............... | G02F 1/13452 349/41 |
| 2008/0165139 A1* | 7/2008 | Hotelling | ............... | G06F 3/041 345/173 |
| 2009/0184919 A1* | 7/2009 | Shinn | ............... | G02F 1/167 345/107 |
| 2010/0208188 A1* | 8/2010 | Tsai | ............... | G02F 1/133305 349/153 |
| 2010/0220072 A1* | 9/2010 | Chien | ............... | G06F 3/041 345/173 |
| 2010/0244005 A1* | 9/2010 | Gyoda | ............... | H01L 51/5237 257/40 |
| 2011/0175869 A1 | 7/2011 | Kim et al. | | |
| 2012/0281380 A1* | 11/2012 | Werner | ............... | G06F 1/1626 361/807 |
| 2013/0027857 A1 | 1/2013 | Jeong | | |
| 2013/0082989 A1 | 4/2013 | Song et al. | | |
| 2013/0135830 A1* | 5/2013 | Lai | ............... | H05K 7/06 361/749 |
| 2014/0063433 A1* | 3/2014 | Benson | ............... | G02F 1/1341 349/155 |
| 2014/0176867 A1* | 6/2014 | Huang | ............... | G02B 6/0081 349/65 |
| 2014/0192491 A1* | 7/2014 | Chiang | ............... | H05K 3/32 361/750 |

FOREIGN PATENT DOCUMENTS

| | | |
|---|---|---|
| KR | 10-2007-0071553 | 7/2007 |
| KR | 10-2012-0126993 | 11/2012 |

* cited by examiner

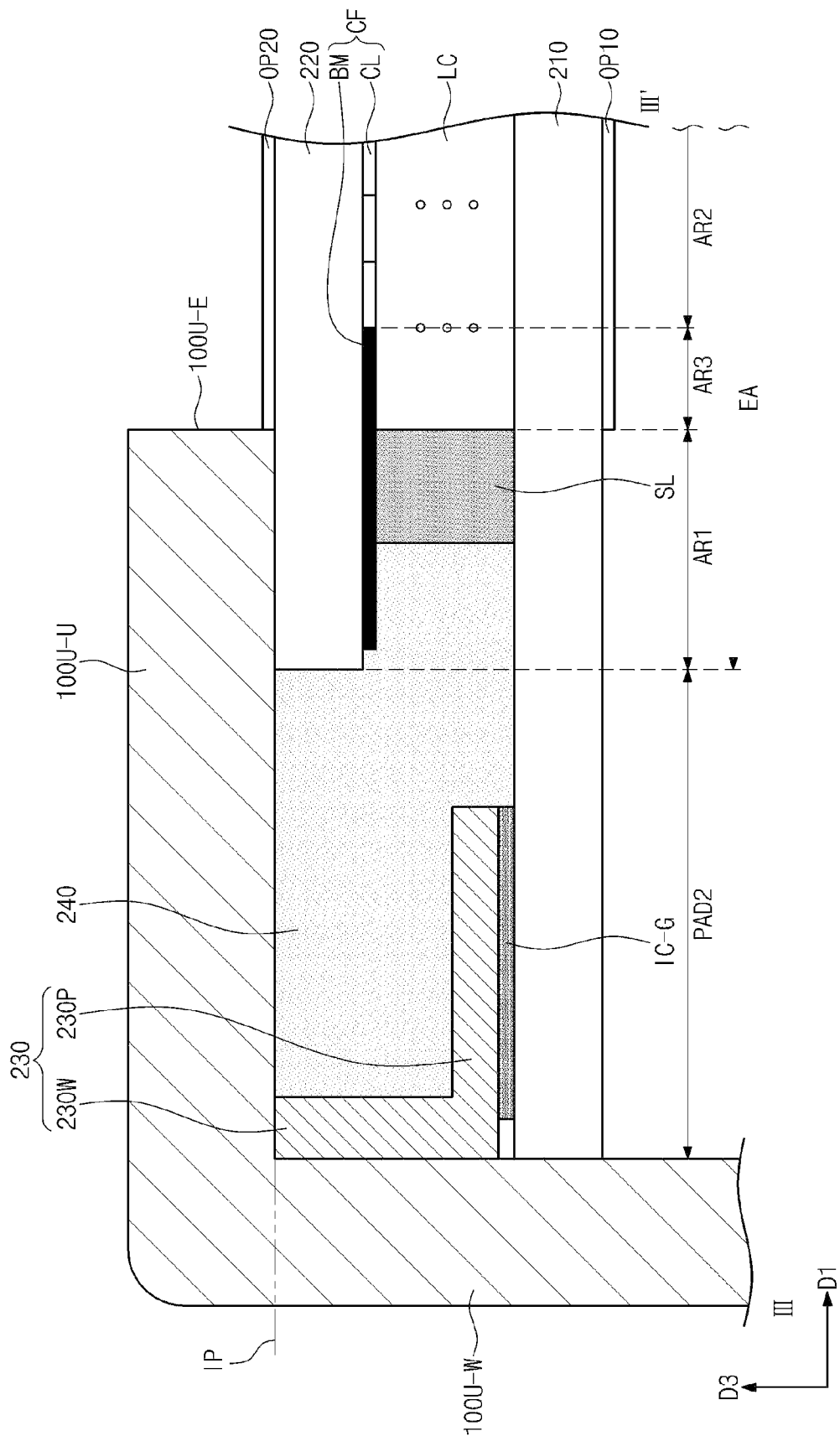

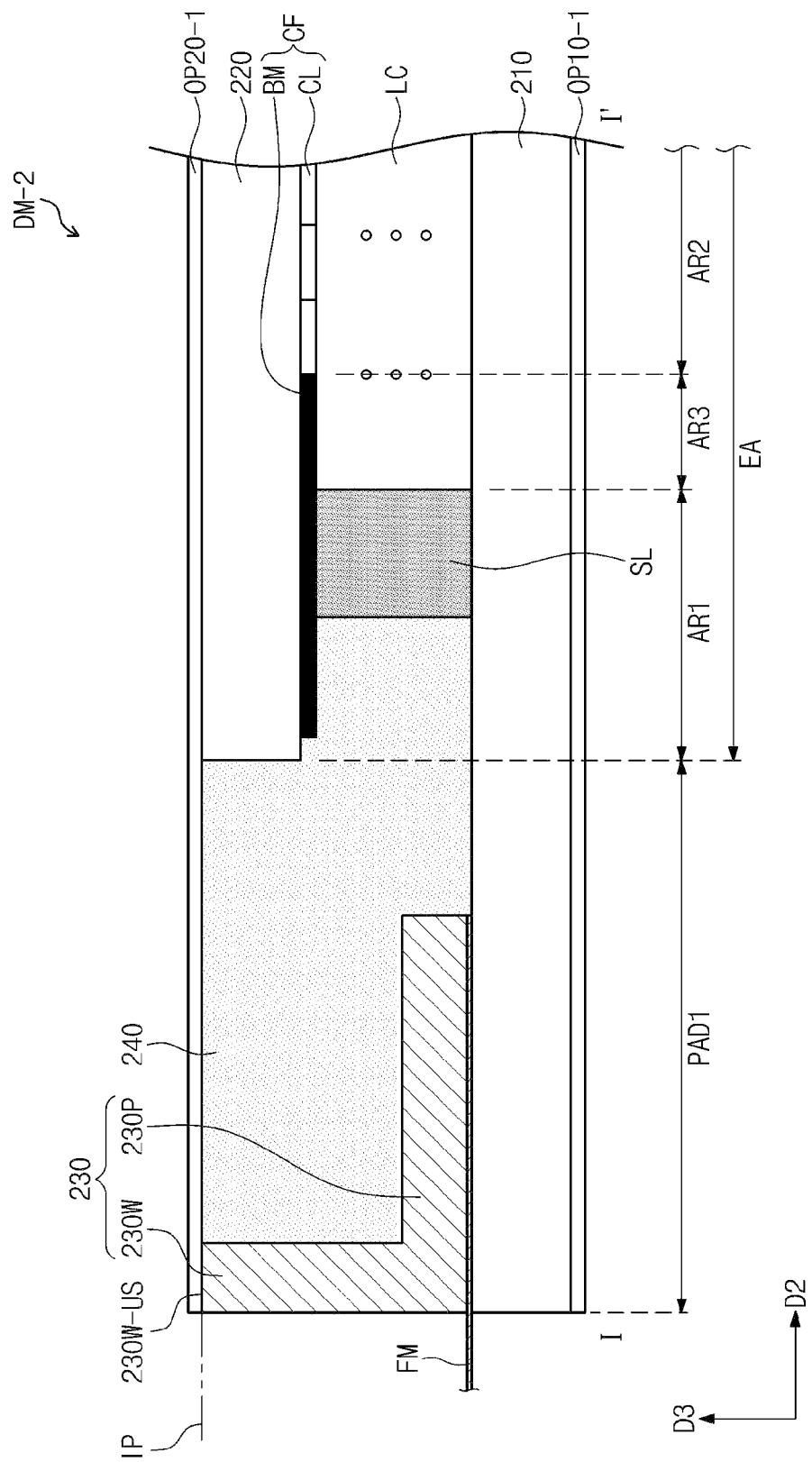

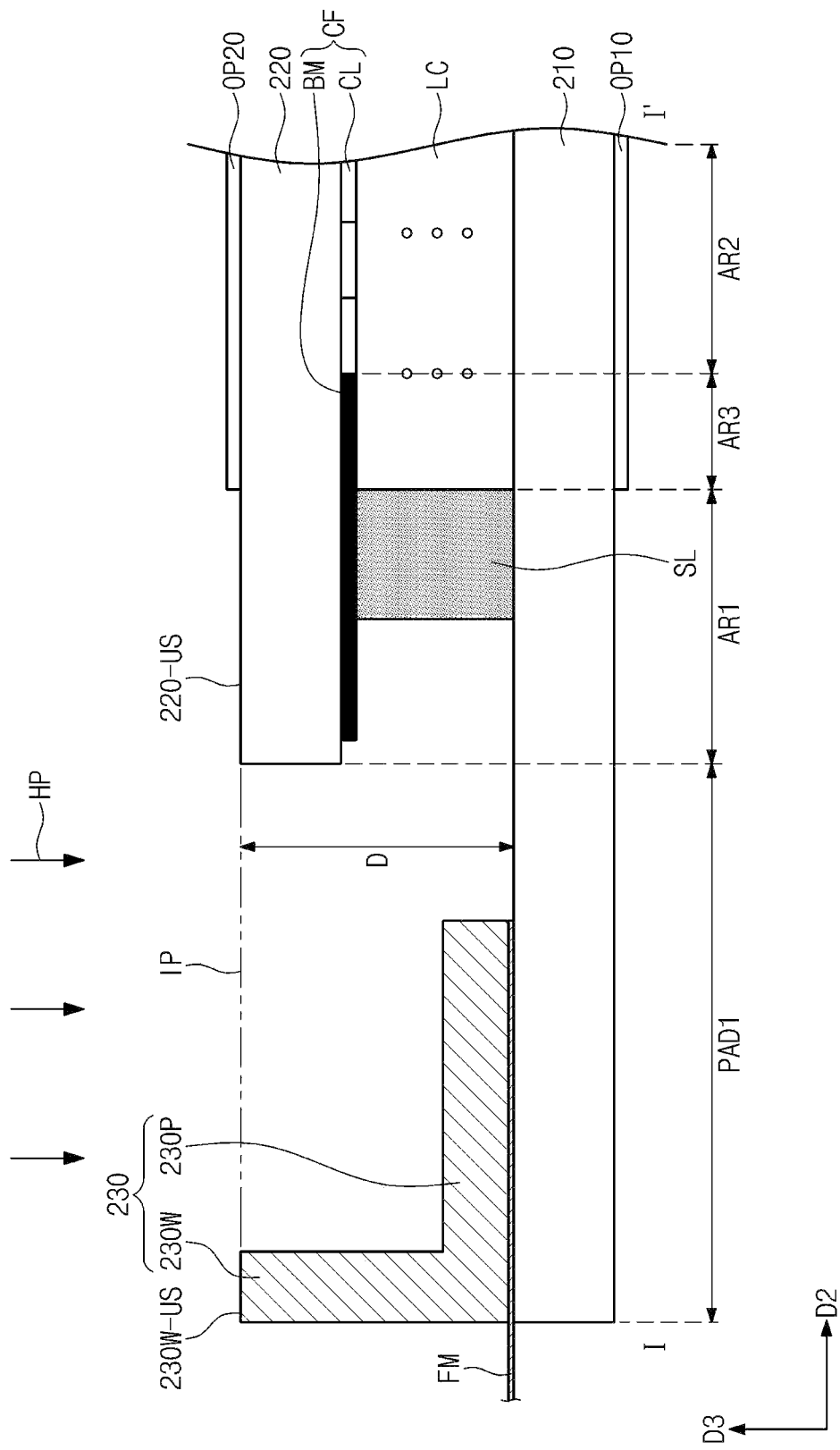

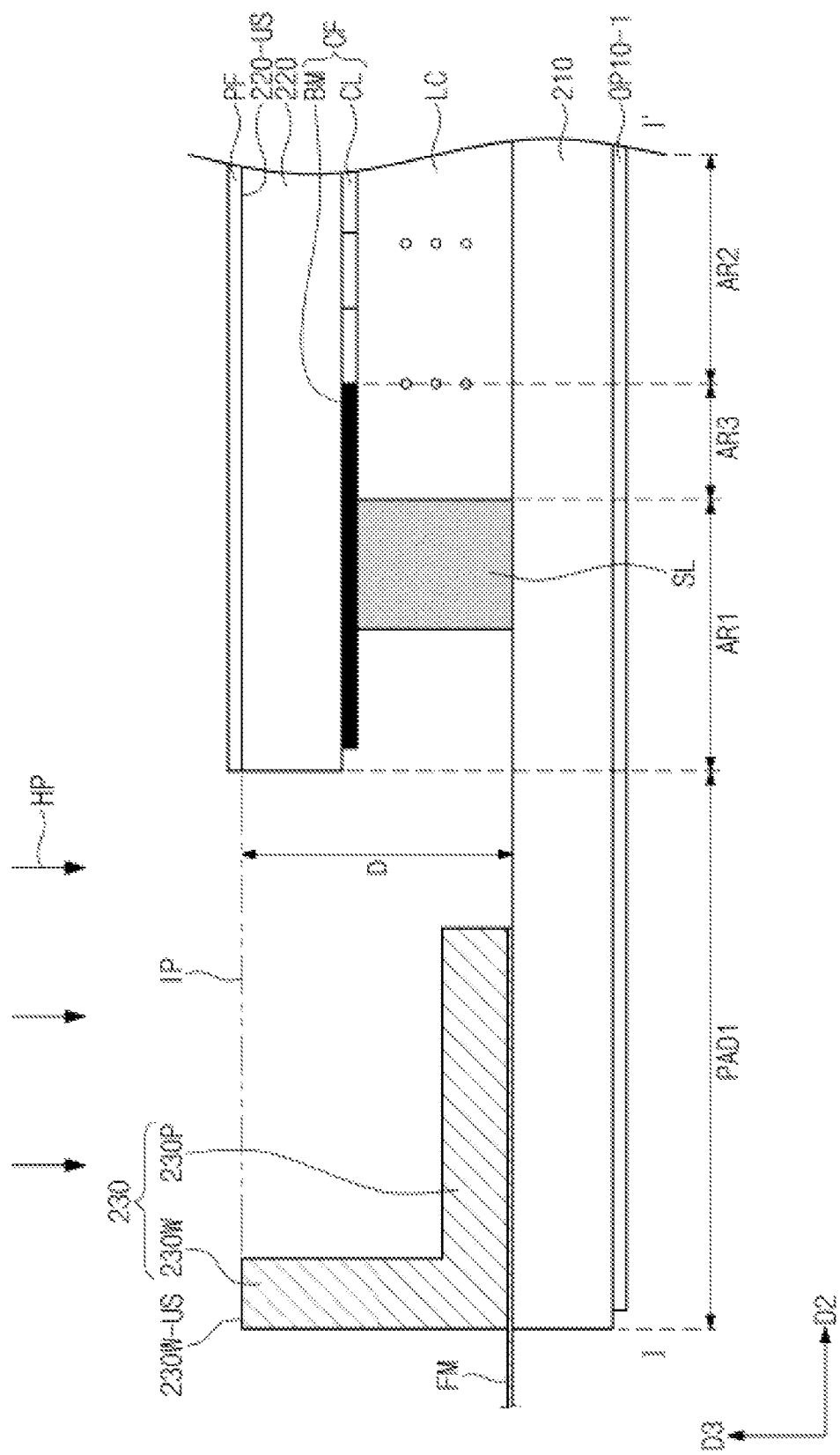

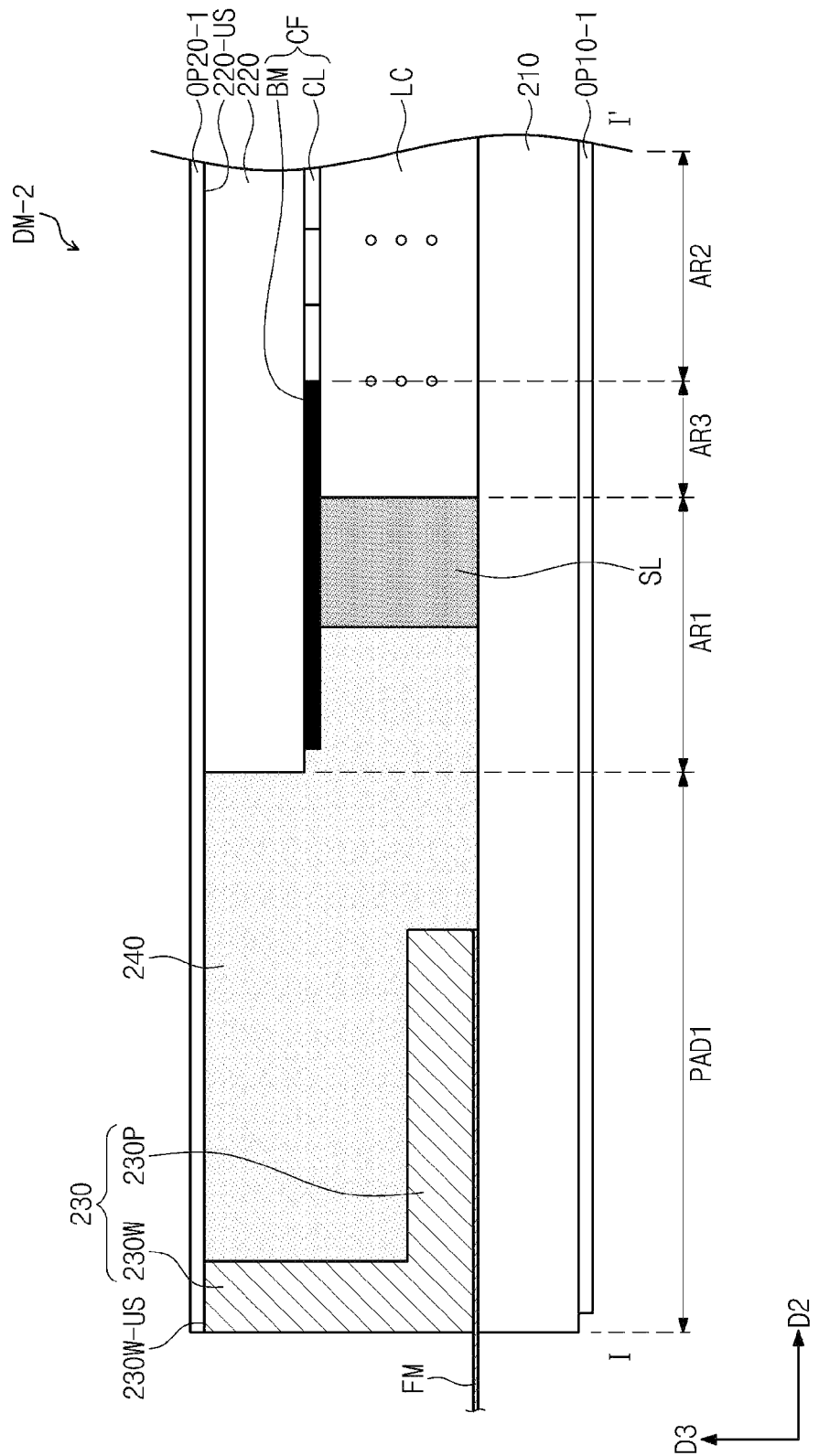

DISPLAY DEVICE AND METHOD OF MANUFACTURING THE SAME

CROSS-REFERENCE TO RELATED APPLICATIONS

This application claims from and benefit of Korean Patent Applications Nos. 10-2014-0012718, filed on Feb. 4, 2014 and 10-2014-0067099, filed on Jun. 2, 2014, which are hereby incorporated by reference for all purposes as if fully set forth herein.

BACKGROUND

Field

Exemplary embodiments relate to a display device and a method of manufacturing the same.

Discussion of the Background

A display device includes a display panel displaying an image, a protection member protecting the display panel, and a variety of electrical components driving the display device. Various elements, that is, the display panel, the protection member, the electrical components, and the likes are assembled to each other to complete the display device to be used in everyday life.

The display device in which the various elements are coupled to each other is required to be stably operated even though external force or impact is applied thereto.

SUMMARY

Exemplary embodiments of the present disclosure provide a display device of which elements are stably assembled to each other and a method of manufacturing the display device.

Additional aspects will be set forth in the detailed description which follows, and, in part, will be apparent from the disclosure, or may be learned by practice of the inventive concept.

Embodiments of the inventive concept provide a display device including a first base substrate including an effective area and a first pad area disposed adjacent to one end of the effective area, a second base substrate disposed to be spaced apart from the first base substrate, overlapping with the effective area, and exposing the first pad area, a sealing member disposed between the first base substrate and the second base substrate, a first supporting member disposed in the first pad area of the first base substrate and spaced apart from the sealing member to define a predetermined space, and a second supporting member filled in the predetermined space.

The display device further includes a plurality of first signal lines each including a line part disposed in the effective area and a pad part connected to the line part disposed in the first pad area, the first signal lines extending in a first direction and a plurality of second signal lines extending in a second direction substantially perpendicular to the first direction. The first supporting member is disposed on the pad part of each of the first signal lines.

The first base substrate further includes a second pad area disposed adjacent to the other end of the effective area, the second signal lines include a plurality of line parts disposed in the effective area and a plurality of pad parts connected to the line parts and disposed in the second pad area, and the first supporting member is disposed in each of the first and second pad areas.

The display device further includes at least one first driving chip electrically connected to the pad parts of the first signal lines to apply a voltage to the pad parts of the first signal lines. The first driving chip is disposed to overlap with the pad parts of the first signal lines in the first pad area, and the first supporting member is disposed on the first driving chip.

The display device further includes a flexible circuit film connected to the pad parts of the second signal lines, a second driving chip mounted on the flexible circuit film, and a main circuit board connected to the flexible circuit film. The first supporting member is disposed on the flexible circuit film.

The sealing member is disposed along an edge of the second base substrate when viewed in a plan view.

The first supporting member includes a plane portion disposed in the first pad area and at least one partition wall extending upward from the plane portion to face the sealing member.

An upper surface of the partition wall defines a substantially same plane surface as an upper surface of the second base substrate.

An upper surface of the second supporting member defines a substantially same plane surface as the upper surface of the partition wall and the upper surface of the second base substrate.

The display device further includes a first optical member disposed under the first base substrate and a second optical member disposed on the second base substrate. The first optical member and the second optical member are overlapped with the effective area.

The second optical member is disposed on a plane surface defined by the upper surface of the partition wall, the upper surface of the second supporting member, and the upper surface of the second base substrate to cover the first pad area.

The display device further includes a cover member including a sidewall portion that covers an edge of the first base substrate and the partition wall of the first supporting member and an upper portion bent from the sidewall portion to cover the first pad area. The upper portion of the cover member is disposed on the plane surface defined by the upper surface of the partition wall, the upper surface of the second supporting member, and the upper surface of the second base substrate.

An edge of the upper portion of the cover member is overlapped with the sealing member.

The display device further includes a third supporting member. The partition wall is provided in plural numbers, the partition walls are spaced apart from each other, and the third supporting member is filled between the partition walls.

The second supporting member includes silicon and the second supporting member further includes a black pigment particle.

Embodiments of the inventive concept provide a method of manufacturing a display device, including preparing a display panel including a pad area at least one side thereof, disposing a driving circuit part in the pad area of the display panel, disposing a first supporting member on the driving circuit part, bonding the driving circuit part to the display panel, and filling a second supporting member in a space defined by the first supporting member and the display panel.

The method further includes grinding an upper surface of the second supporting member so that the upper surface of the second supporting member has a substantially same plane surface as an upper surface of the display panel.

Embodiments of the inventive concept provide a method of manufacturing a display device, including preparing a display panel including a pad area at least one side thereof, bonding a first optical member on a lower surface of the display panel, bonding a protection film on an upper surface of the display panel, disposing a flexible circuit film in the pad area of the display panel, disposing a first supporting member on the flexible circuit film, bonding the flexible circuit film to the display panel, filling a second supporting member in a space defined by the first supporting member and the display panel, removing the protection film from the upper surface of the display panel, and bonding a second optical member on the upper surface of the display panel to cover the pad area.

The display device according to an exemplary embodiment of the present disclosure includes the supporting member disposed in the pad area. Therefore, although the overlap area between the cover member and the display panel becomes small, the display panel is stably assembled by the supporting member, thus improving the reliability of the display panel.

In addition, the display device effectively prevents moisture from entering the display panel even with reduced bezel area.

Further, the display panel having the reduced bezel area and the improved reliability may be manufactured by the manufacturing method.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 4C is a cross-sectional view taken along a line III-III' of FIG. 3;

FIG. 6 is a cross-sectional view showing a portion of a display device according to an exemplary embodiment of the present disclosure;

FIGS. 7A to 7E are cross-sectional views showing a manufacturing method of a display device according to an exemplary embodiment of the present disclosure; and FIGS. 8A to 8E are cross-sectional views showing a manufacturing method of a display device according to an exemplary embodiment of the present disclosure.

DETAILED DESCRIPTION OF THE ILLUSTRATED EMBODIMENTS

Figure 1:
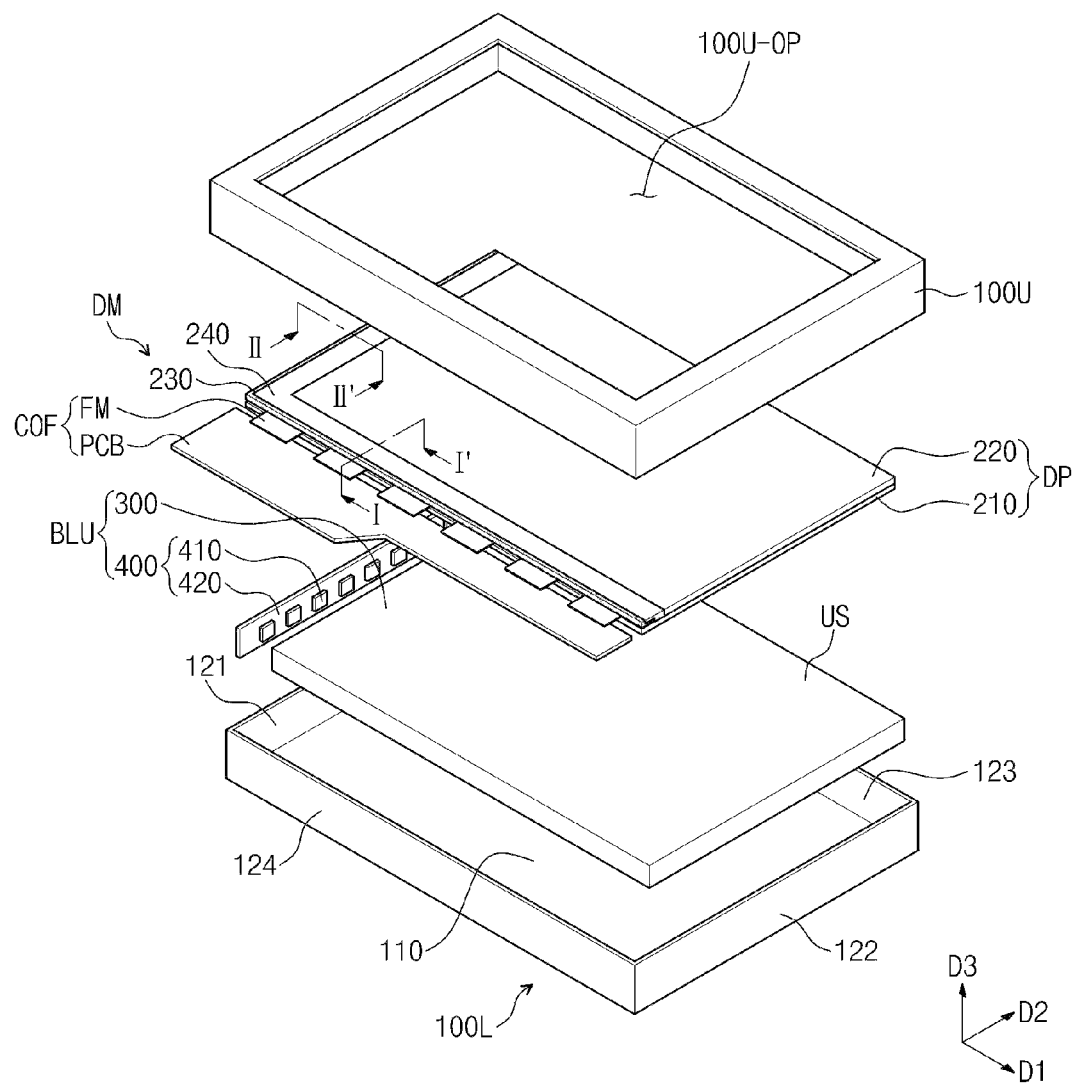
FIG. 1 is an exploded perspective view showing a display device according to an exemplary embodiment of the present disclosure.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Hereinafter, the present disclosure will be explained in detail with reference to the accompanying drawings.

Figure 2:
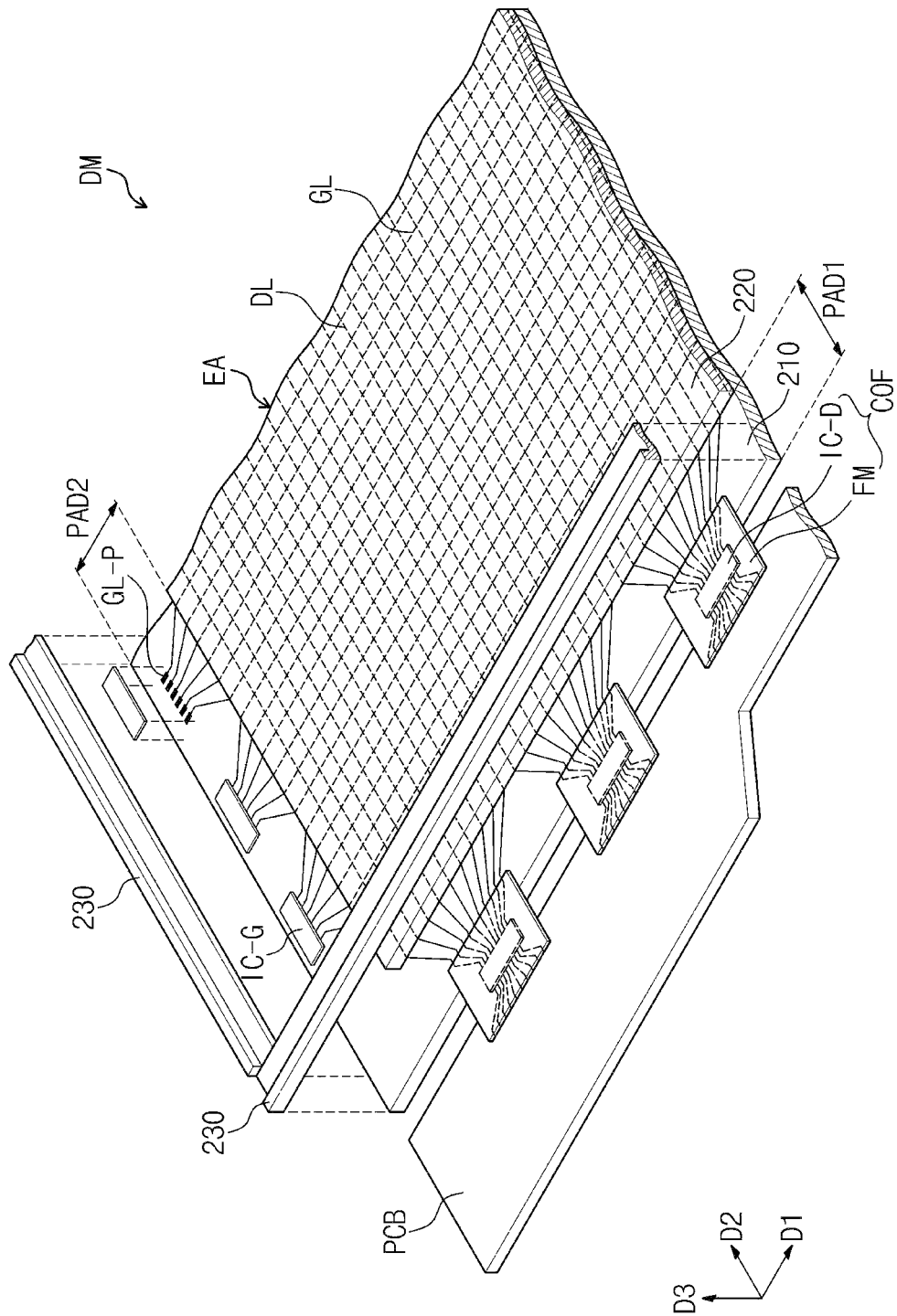
FIG. 2 is a perspective view showing a portion of the display device according to an exemplary embodiment of the present disclosure.
Figure 3:
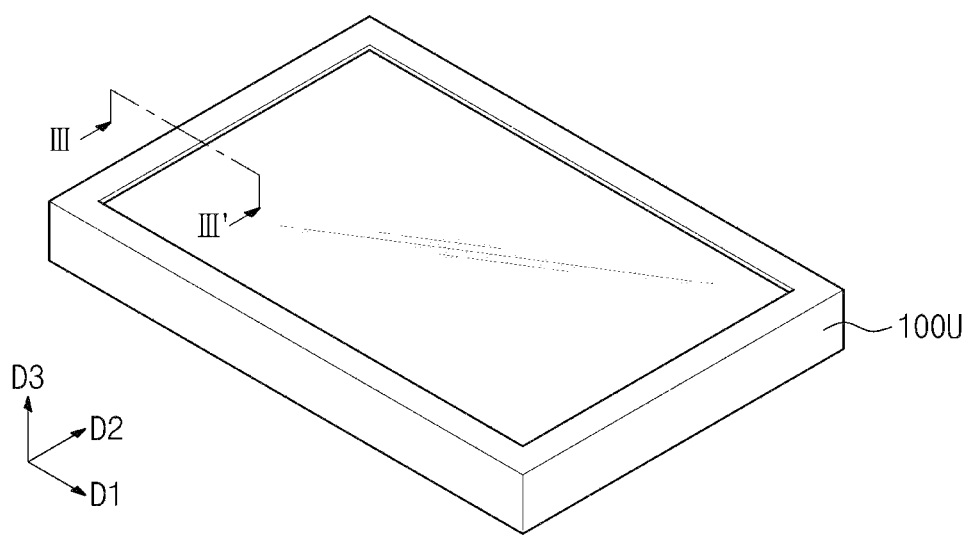
FIG. 3 is a perspective view showing a coupling state of the display device according to an exemplary embodiment of the present disclosure.

FIG. 1 is an exploded perspective view showing a display device according to an exemplary embodiment of the present disclosure, FIG. 2 is a perspective view showing a portion of the display device of FIG. 1, and FIG. 3 is a perspective view showing a coupling state of the display device according to an exemplary embodiment of the present disclosure. However, some elements are omitted in FIG. 2 for the convenient explanation. Hereinafter, the structure of the display device will be described in detail with reference to FIGS. 1 to 3.

A display device according to the present exemplary embodiment includes protection members 100U and 100L, a display module DM, and a backlight unit BLU. In the present exemplary embodiment, the protection members 100U and 100L include an upper protection member (or cover member) 100U and a lower protection member 100L. Meanwhile, at least one of the upper protection member 100U and the lower protection member 100L may be omitted in the display device according to the present exemplary embodiment. The upper protection member 100U is disposed on an upper portion of the display module DM. The upper protection member 100U covers the display module DM and outer portions of the lower protection member 100L.

The upper protection member 100U is provided with an opening 100U-OP formed therethrough. The opening 100U-OP exposes a portion of the display module DM, e.g., a display area in which an image is displayed. The upper protection member 100U may have a frame shape surrounding edges of the display module DM.

The lower protection member 100L is coupled to the upper protection member 100U. The lower protection member 100L accommodates the backlight unit BLU therein. The lower protection member 100L includes a bottom portion 110 and a sidewall portion 121, 122, 123, 124 extending upward from the bottom portion 110.

The bottom portion 110 may have a rectangular shape that is overlapped with the backlight unit BLU when viewed in a plan view. The sidewall portion extends upward from four sides of the bottom portion 110. The sidewall portion is divided into four portions respectively corresponding to the four sides of the bottom portion 110.

The four portions include first sidewalls 121 and 122 disposed to face each other in a first direction D1 and second sidewalls 123 and 124 disposed to face each other in a second direction D2 substantially perpendicular to the first direction D1. The four portions 121, 122, 123, 124 surround the bottom portion 110.

The display module DM receives a light from the backlight unit BLU and generates the image. The display module DM includes a display panel DP, a driving circuit part connected to the display panel DP, and a first supporting member 230 and a second supporting member 240, which are disposed at edges of the display panel DP.

The display panel DP is a transmissive or transflective display panel. For instance, the display panel DP may be an organic light emitting display panel, a liquid crystal display panel, an electro-phoretic display panel, or an electro-wetting display panel. In the present exemplary embodiment, the liquid crystal display panel will be described as the display panel DP.

The display panel DP includes a first base substrate 210 and a second base substrate 220, which face each other. Although not shown in figures, a sealing member may be interposed between the first and second base substrates 210 and 220. The sealing member is disposed along edges of the second base substrate 220 to seal the first base substrate 210 and the second base substrate 220.

Referring to FIG. 2, the first base substrate 210 includes an effective area EA and at least one pad area PAD1 and PAD2 disposed adjacent to the effective area EA. The display module DM according to the present exemplary embodiment may include a first pad area PAD1 and a second pad area PAD2. The first pad area PAD1 may be connected to the second pad area PAD2.

A plurality of pixels (not shown) is disposed in the effective area EA. Each of the pixels includes at least one thin film transistor (not shown) and a pixel electrode (not shown) connected to the thin film transistor.

A plurality of signal lines respectively connected to the pixels is disposed in the effective area EA. The signal lines include gate lines GL and data lines DL.

The gate lines GL extend in the first direction D1 and are arranged in the second direction D2 substantially perpendicular to the first direction D1. Each gate line GL applies a gate voltage to a corresponding pixel of the pixels.

Each of the gate lines GL includes a line part disposed in the effective area EA and a pad part GL-P corresponding to the line part disposed in the second pad area PAD2. The pad part GL-P is disposed at an end portion of each gate line.

The data lines DL extend in the second direction D2 and are insulated from the gate lines GL. Each data line DL applies a data voltage to a corresponding pixel of the pixels.

Each of the signal lines includes a line part disposed in the effective area EA and a pad part coupled to the line part disposed in the pad areas. The line part may extend to the pad part in the pad areas so that the pad part may be disposed at an end portion of the line part. For instance, each of the gate lines GL includes the pad part GL-P disposed in the second pad area PAD2. Each of the data lines DL includes the pad part (not shown) disposed in the first pad area PAD1.

The second base substrate 220 is disposed on the first base substrate 210. The second base substrate 220 is spaced apart from the first base substrate 210 in a thickness direction D3 (hereinafter, referred to as a third direction). The second base substrate 220 is overlapped with the effective area EA of the first base substrate 210.

The second base substrate 220 exposes at least one side of the first base substrate 210 to define at least one pad area. In the present exemplary embodiment, the second base substrate 220 exposes the first pad area PAD1 and the second pad area PAD2.

The driving circuit part includes a printed circuit board PCB and a first driving chip IC-G and a chip on film COF, which are disposed on the first base substrate 210. The chip on film COF includes a flexible circuit film FM and a second driving chip IC-D. Each of the first driving chip IC-G and the chip on film COF may be provided in plural numbers.

The printed circuit board PCB is disposed adjacent to the one side of the first base substrate 210. The printed circuit board PCB includes devices (not shown) mounted thereon. The printed circuit board PCB is connected to one side of the flexible circuit film FM. The printed circuit board PCB is electrically coupled to the pad parts of the data lines DL. A data driving signal output from the device mounted on the printed circuit board PCB is applied to the data lines DL through the flexible circuit film FM.

The first driving chip IC-G may be, but not limited to, a gate driver. The first driving chip IC-G applies a gate signal to the gate lines GL. The first driving chip IC-G is connected to the pad parts GL-P of the gate lines GL. The first driving chip IC-G applies the gate voltages to the pad parts GL-P of the gate lines GL. The first driving chip IC-G is disposed on the first base substrate 210 to directly make contact with the pad parts GL-P of the gate lines GL. According to another exemplary embodiment, the first driving chip IC-G may be mounted on a flexible film and coupled to the pad parts GL-P of the gate lines GL.

The second driving chip IC-D may be, but not limited to, a data driver. The second driving chip IC-D is coupled to the pad parts (not shown) of the data lines DL. The pad parts of the data lines DL may have the same shape as that of the pad parts GL-P of the gate lines GL. The second driving chip IC-D applies the data voltage to the pad parts of the data lines DL.

The other side of the flexible circuit film FM is connected to the pad parts of the data lines DL. The second driving chip IC-D is mounted on one surface of the flexible circuit film FM and disposed adjacent to the one side of the first base substrate 210. The flexible circuit film FM includes a plurality of circuits formed thereon to electrically couple the pad parts and other elements. In the present exemplary embodiment, the second driving chip IC-D is mounted on a lower surface of the flexible circuit film FM.

Meanwhile, in the display device according to the present exemplary embodiment of the present disclosure, the second driving chip IC-D may be directly disposed on the pad parts to correspond to the first driving chip IC-G. In this case, the flexible circuit film FM may be not be necessary.

Although not shown in figures, the display module DM further includes a conductive adhesive member disposed between the flexible circuit film FM and the first base substrate 210. The flexible circuit film FM is electrically coupled to the first base substrate 210 by the conductive adhesive member. The conductive adhesive member may be an adhesive including a conductive ball or an anisotropic conductive film.

The first supporting member 230 is disposed in the pad areas PAD1 and PAD2 of the first base substrate 210. The first supporting member 230 may be disposed to cover at least the pad parts, such as the pad parts GL-P of the gate liens GL and the pad parts (not shown) of the data lines DL. The first supporting member 230 may be provided in plural numbers and the first supporting members 230 respectively cover the pad parts, or the first supporting member 230 may be integrally formed as a single unitary and individual unit to cover the entire pad parts disposed in the pad areas PAD1 and PAD2.

The first supporting member 230 may be disposed in each of the first pad area PAD1 and the second pad area PAD2 or the first supporting member 230 may have an integral shape including a first portion extending in the first direction D1 and a second portion extending in the second direction D2. However, the shape of the first supporting member 230 should not be limited thereto or thereby.

The first supporting member 230 may be disposed on the flexible circuit film FM in the first pad area PAD1. The first supporting member 230 is disposed to overlap with the flexible circuit film FM and the pad parts (not shown) of the data lines DL.

In addition, the first supporting member 230 may be disposed on the first driving chip IC-G in the second pad area PAD2. The first supporting member 230 is disposed to overlap with the pad parts GL-P of the gate lines GL and covers the first driving chip IC-G.

As shown in FIG. 1, the second supporting member 240 is disposed in the first and second pad areas PAD1 and PAD2 of the first base substrate 210. The second supporting member 240 is filled in a predetermined space defined by the first supporting member 230, the first base substrate 210, and the sealing member (not shown). The second supporting member 240 reduces a step difference between the first base substrate 210 and the second base substrate 220 in cooperation with the first supporting member 230. Details on the above will be described later.

The backlight unit BLU is disposed under the display module DM. The backlight unit BLU provides the light to the entire surface of the display panel DP. The backlight unit BLU includes a light guiding member 300 and a light source 400.

The light guiding member 300 is disposed under the display panel DP. The light guiding member 300 guides the light from the light source 400 toward the display module DM.

The light guiding member 300 includes a first surface US, a second surface (not shown), and a plurality of connection surfaces connecting the first surface US and the second surface. The light guiding member 300 includes at least one light incident surface and one light exiting surface.

The light emitted from the light source 400 is incident to the light incident surface. The light incident surface is disposed to face the light source 400. In the present exemplary embodiment, the light incident surface may be one of the connection surfaces.

The light incident to the light guide member 300 through the light incident surface exits through the light exiting surface to travel to the display panel DP. The light exiting surface corresponds to one of the first surface US or the second surface, which faces the display panel DP. In the present exemplary embodiment, the light exiting surface corresponds to the first surface US.

The light source 400 generates the light. The light source 400 includes a light emitting device 410 and a circuit substrate 420. As shown in FIG. 1, the light source 400 includes a plurality of light emitting devices 410.

The light emitting devices 410 are mounted on the circuit substrate 420. The circuit substrate 420 is electrically coupled to the light emitting devices 410. Although not shown in figures, the circuit substrate 420 includes a plurality of circuit substrates to respectively correspond to the light emitting devices 410.

In the present exemplary embodiment, the circuit substrate 420 is disposed under the light emitting device 410, but it should not be limited thereto or thereby. That is, the circuit substrate 420 may be disposed on a side surface of the light emitting device 410.

Although not shown in FIGS. 1 to 3, the display device may further include at least one optical member. The optical member includes polarization films respectively attached to an upper surface and a lower surface of the display panel DP.

The optical member may further include a reflection sheet that reflects a portion of the light traveling to a lower portion of the light guiding member 300 among the light incident to the light guiding member 300. The reflection sheet may be disposed under the light guiding member 300 and accommodated in the lower protection member 100L. And the optical member may further include diffusion sheet that diffuses the light exiting through the first surface US of the light guiding member 300 to uniformly provide the light to the display panel DP.

Figure 4A:
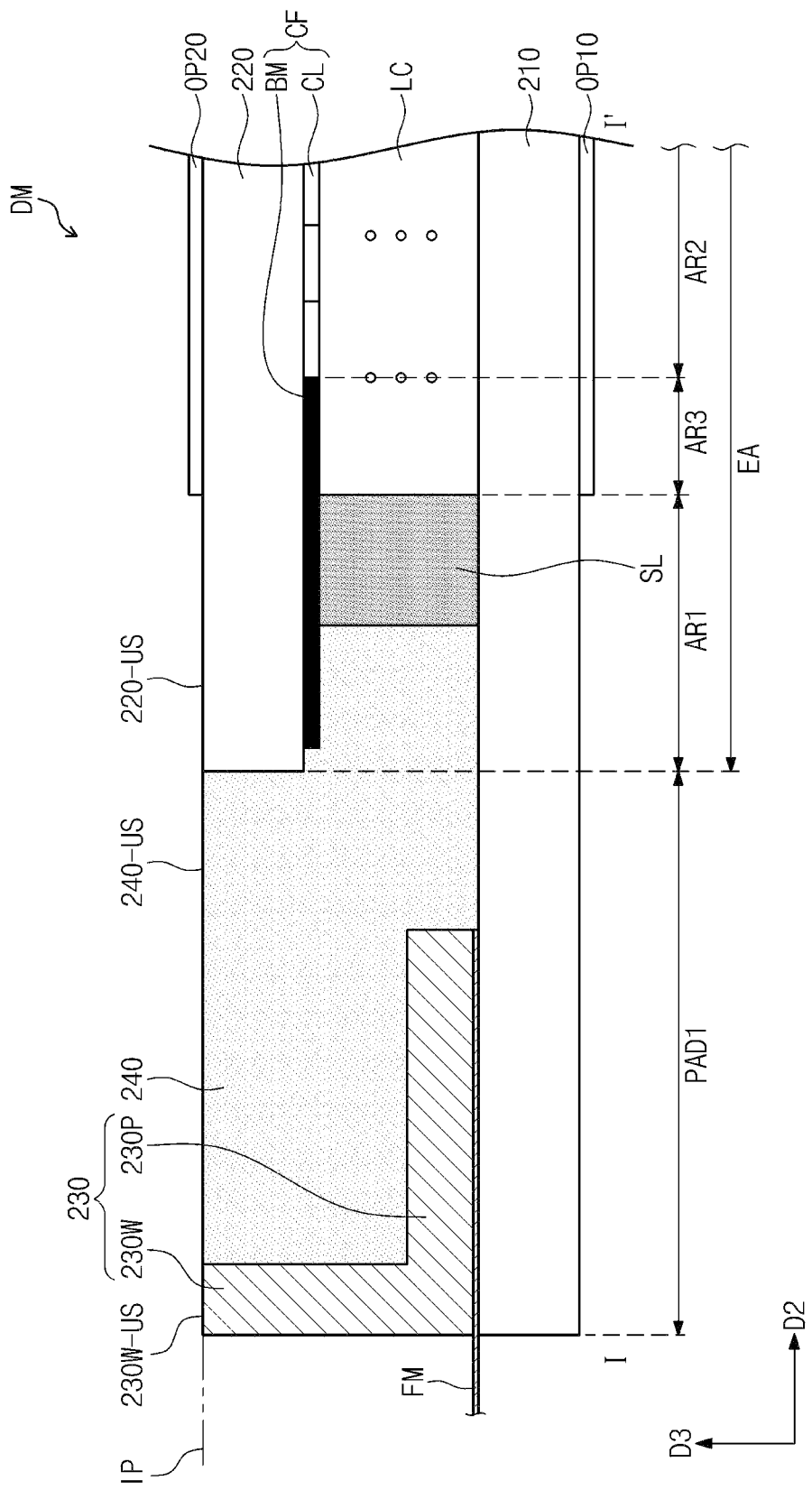
FIG. 4A is a cross-sectional view taken along a line I-I' of FIG. 1.
Figure 4B:
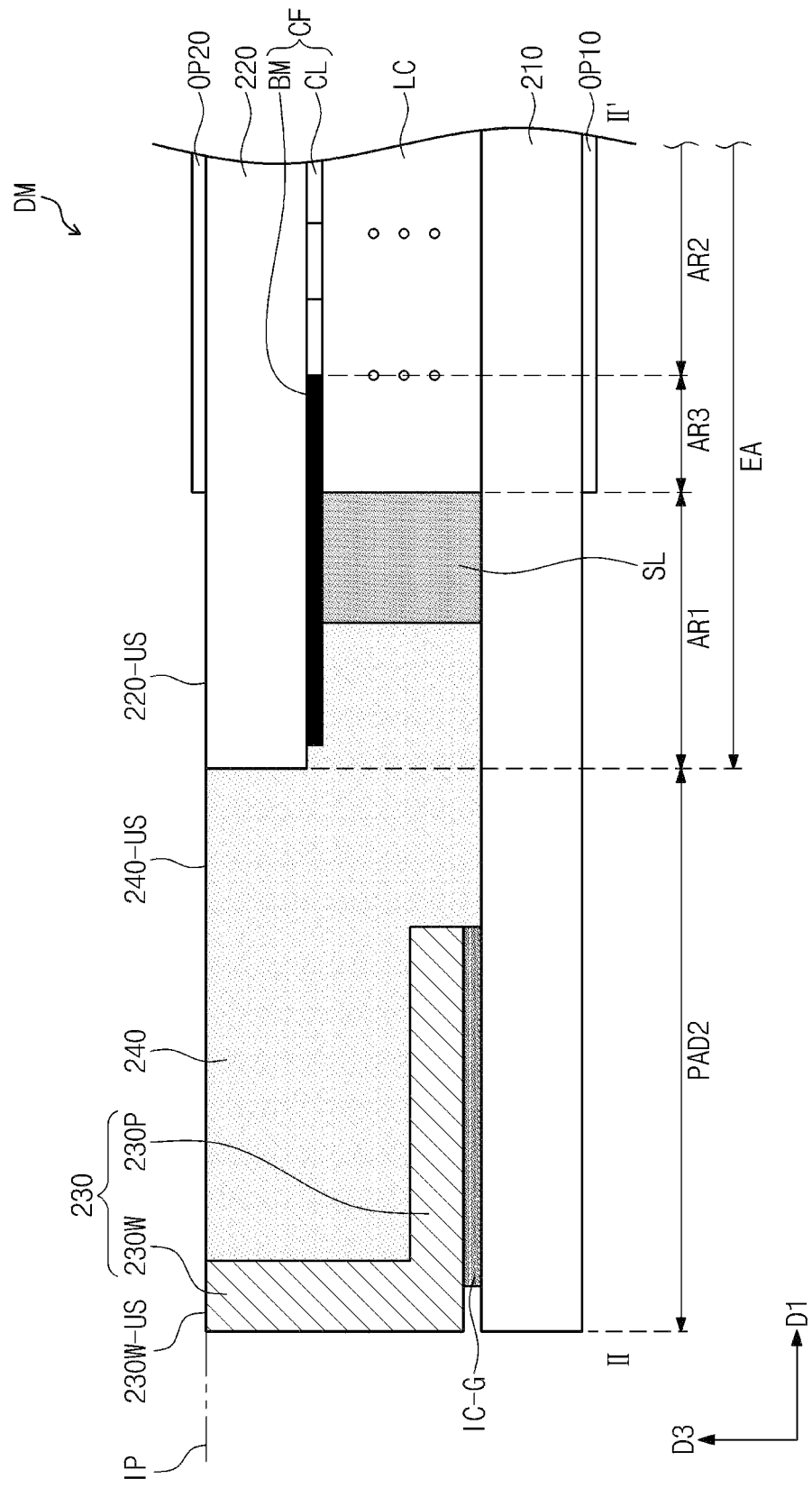
FIG. 4B is a cross-sectional view taken along a line II-II' of FIG. 1.

FIG. 4A is a cross-sectional view taken along a line I-I' of FIG. 1, FIG. 4B is a cross-sectional view taken along a line II-II' of FIG. 1, and FIG. 4C is a cross-sectional view taken along a line III-III' of FIG. 3. In FIGS. 4A to 4C, the same reference numerals denote the same elements in FIGS. 1 to 3, and thus detailed descriptions of the same elements will be omitted.

Although not shown in figures, the first base substrate 210 includes a plurality of insulating layers. The thin film transistor (not shown) and the signal lines (not shown) are disposed between the insulating layers.

As shown in FIG. 2, Among the signal lines, some signal lines extend to the second pad area PAD2 and end portions of the signal lines are exposed through the insulating layers to form the pad parts GL-P (refer to FIG. 2) of the gate lines. In addition, the other signal lines extend to the first pad area PAD1 (refer to FIG. 2) and end portions of the signal lines are exposed through the insulating layers to form the pad parts (not shown) of the data lines.

As shown in FIG. 4A, a color filter layer CF is disposed under the second base substrate 220. The color filter layer CF includes a color pattern CL having at least one color and a black matrix BM disposed adjacent to the color pattern CL. The black matrix BM prevents a light leakage at the edge of the second base substrate 220.

A liquid crystal layer LC is interposed between the first base substrate 210 and the second base substrate 220. A director of liquid crystal molecules of the liquid crystal layer LC is controlled by an electric field and an amount of light passing through the color pattern CL is adjusted, and thus displaying desired images.

The sealing member SL is disposed between the first base substrate 210 and the second base substrate 220. The sealing member SL is disposed along the edge of the second base substrate 220 to seal the liquid crystal layer LC. Although not shown in figures, the sealing member SL is provided in plural numbers.

The sealing member SL is formed of various materials. The sealing member SL protects the liquid crystal layer LC from moisture or pollution. For instance, the sealing member SL may include a thermosetting resin or an ultraviolet-curing resin.

The display module DM according to the present exemplary embodiment is divided into the pad areas PAD1 and PAD2 and the effective area EA disposed adjacent to the pad areas PAD1 and PAD2 when viewed in a plan view. The effective area EA includes a sealing area AR1 overlapping with at least the sealing member SL, the pixel area AR2 overlapping with the color pattern CL, and an intermediate area AR3 disposed between the sealing area AR1 and the pixel area AR2.

The sealing area AR1 is an area where the sealing member SL is disposed among areas overlapped with the black matrix BM. The sealing area AR1 may be defined as an area from the edge of the second base substrate 220 to the sealing member SL.

The pixel area AR2 is an area where the pixels (not shown) are disposed. The pixel area AR2 overlaps with the color pattern CL. The pixel area AR2 transmits the light to display the image.

The intermediate area AR3 overlaps with the black matrix BM and a portion of the liquid crystal layer LC. Foreign substances entering into the liquid crystal layer LC through the sealing member SL may be diffused in the intermediate area AR3.

The intermediate area AR3 corresponds to a boundary area between a bezel area and a display area of the display device according to the present exemplary embodiment of the present disclosure. The bezel area is disposed along the edge of the display device, and no image is displayed in the bezel area. For instance, the bezel area is overlapped with the pad areas PAD1 and PAD2, the sealing area AR1, and the intermediate area AR3.

As shown in FIG. 4A, the first supporting member 230 is disposed in the first pad area PAD1. The first supporting member 230 includes a plane portion 230P and at least one partition wall 230W.

The plane portion 230P is disposed substantially in parallel with the first base substrate 210. The plane portion 230P is disposed on the pad part (not shown) of the data line and the flexible circuit film FM connected to the pad part of the data line. The plane portion 230P covers the pad part of the data line and the flexible circuit film FM.

The partition wall 230W extends in the third direction D3 from the plane portion 230P. The partition wall 230W includes an upper surface 230W-US. The upper surface 230W-US of the partition wall 230W supports elements disposed on the first supporting member 230. The upper surface 230W-US of the partition wall 230W defines the substantially same plane surface as an upper surface 220-US of the second base substrate 220.

As shown in FIG. 4A, the first supporting member 230 is spaced apart from the sealing member SL. The first supporting member 230, the first base substrate 210, and the sealing member SL defines the predetermined space. The second supporting member 240 is filled in the predetermined space. The second supporting member 240 includes an upper surface 240-US defining the same plane surface as the upper surface 220-US of the second base substrate 220 and the upper surface 230W-US of the partition wall 230W.

The second supporting member 240 does not make contact with the flexible circuit film FM. The first supporting member 230 protects the flexible circuit film FM from the second supporting member 240. Thus, even though the second supporting member 240 is cured by light or heat, the flexible circuit film FM is protected from the light or heat damage.

The second supporting member 240 may include a curing material in a liquid form. For instance, the second supporting member 240 may include silicon. In addition, the second supporting member 240 further may include black pigment particles. The second supporting member 240 including the black pigment particles may prevent the light from leaking to the first pad area PAD1.

The second supporting member 240 may include the same material as the sealing member SL. In this case, the second supporting member 240 serves as a second sealing member to the liquid crystal layer LC in cooperation with the sealing member SL, thus securely sealing the liquid crystal layer LC.

The second supporting member 240 may reduce the intermediate area AR3 in width, which corresponds to a maximum distance through which the moisture moves. The intermediate area AR3 protects the pixel area AR2 from the moisture diffused through the sealing member SL. The bigger intermediate area AR3 protects the pixel area AR2 from foreign substances, but also increases the bezel area.

In addition, since the display device according to the present exemplary embodiment of the present disclosure further includes the second supporting member 240, the liquid crystal layer LC is sealed twice. The second supporting member 240 minimizes moisture or pollution entering into the liquid crystal layer LC. It also reduces the size of the intermediate area AR3 and decreased the bezel area.

As shown in FIG. 4B, the first supporting member 230 is disposed on the first driving chip IC-G in the second pad area PAD2. The upper surface 230W-US of the first supporting member, the upper surface 240-US of the second supporting member 240, and the upper surface 220-US of the second base substrate 220 define the same plane surface IP.

The first supporting member 230 protects the first driving chip IC-G from the second supporting member 240. Accordingly, even though the second supporting member 240 is cured by light or heat, the first driving chip IC-G is protected from the light or heat damage.

FIG. 4C shows the coupling state of the display module DM shown in FIG. 4B and the upper protection member (or cover member) 100U (refer to FIG. 1). Referring to FIG. 4C, the display module DM is covered by the upper protection member 100U. The upper protection member 100U includes a sidewall portion 100U-W and an upper portion 100U-U.

The sidewall portion 100U-W of the upper protection member 100U covers a side surface of the display module DM. The sidewall portion 100U-W covers a side surface of the first base substrate 210 and a side surface of the partition wall 230W of the first supporting member 230. The sidewall portion 100U-W aligns a position of the display module DM.

The upper portion 100U-U of the upper protection member 100U is bent from the sidewall portion 100U-W and extends in the first direction D1. An end portion 100U-E of the upper portion 100U-U defines the opening portion 100U-OP (refer to FIG. 1) of the upper protection member 100U. The upper portion 100U-U is overlapped with a portion of the display module DM when viewed in a plan view. For instance, the upper portion 100U-U is overlapped with at least the pad areas PAD1 and PAD2.

The upper surface 220-US of the second base substrate 220, the upper surface 230W-US of the first supporting member 230, and the upper surface 240-US of the second supporting member 240 define the same plane surface IP. The plane surface IP supports the upper portion 100U-U of the upper protection member 100U.

The end portion 100U-E of the upper portion 100U-U overlaps with the sealing area AR1. In the display module DM according to the present exemplary embodiment, an area overlapping the upper portion 100U-U supports the upper protection member 100U. Since the display device further includes the first supporting member 230 and the second supporting member 240, an area of the upper portion 100U-U, which does not overlap with the second base substrate 220, is supported by the first and second supporting members 230 and 240.

Accordingly, the upper portion 100U-U of the upper protection member 100U is stably supported by a relatively small area of the second base substrate 220. The upper protection member 100U is stably coupled to the display module DM even though the end portion 100U-E of the upper portion 100U-U does not extend to the intermediate area AR3.

The display device according to the present exemplary embodiment may enhance supportive force against the upper protection member 100U in the pad areas. Thus, although the upper protection member 100U supports only a portion of the first base substrate 210, the second base substrate 220 is protected from bending and the first base substrate 210 is prevented from being detached from the upper protection member 100U.

Figure 5:
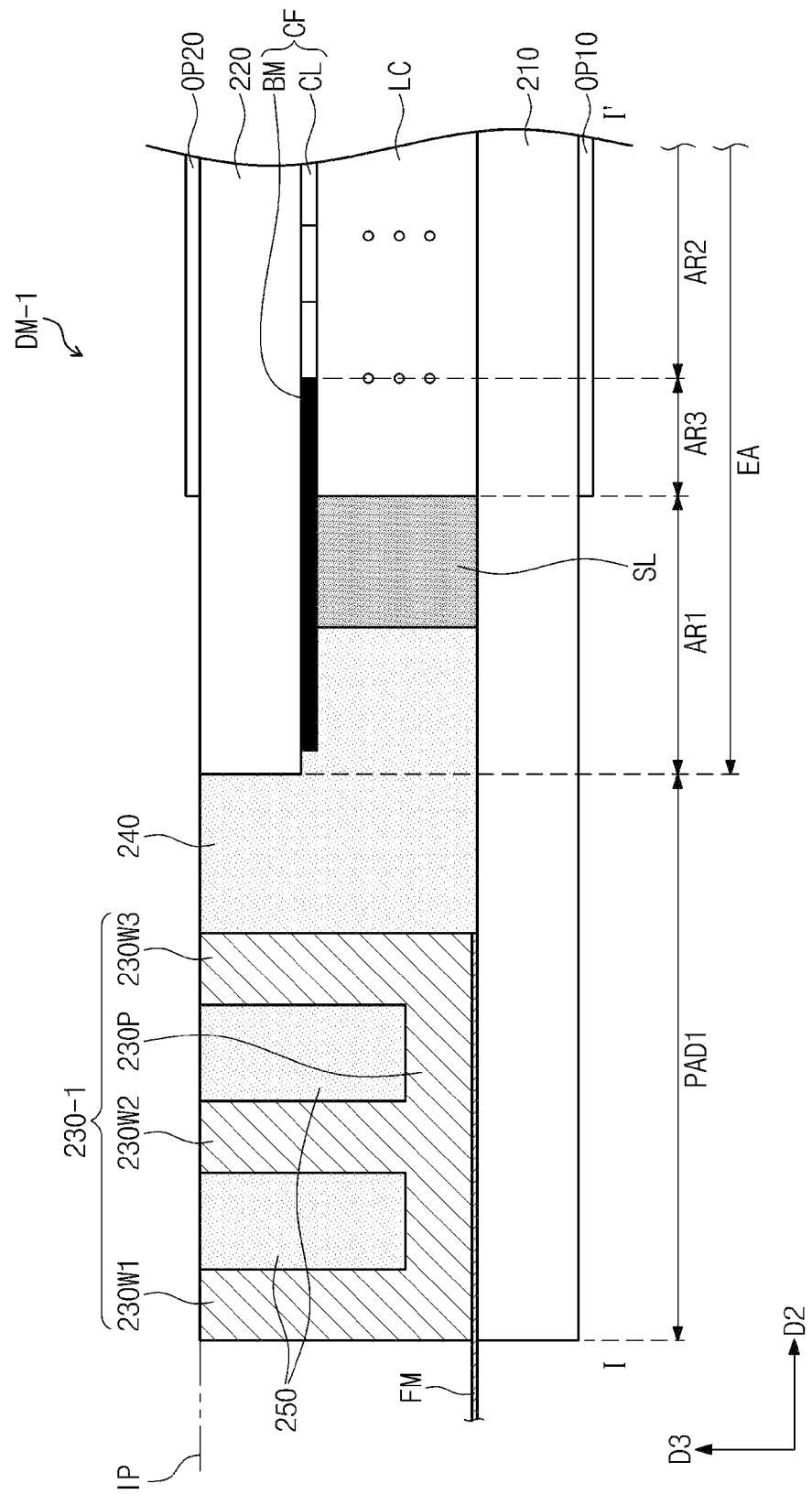
FIG. 5 is a cross-sectional view showing a portion of a display device according to an exemplary embodiment of the present disclosure.

FIG. 5 is a cross-sectional view showing a portion of a display device according to another exemplary embodiment of the present disclosure. As shown in FIG. 5, a first supporting member 230-1 may have various shapes. In the present exemplary embodiment, the first supporting member 230-1 includes a plane portion 230P, and partition walls 230W1, 230W2, and 230W3.

The partition walls 230W1, 230W2, and 230W3 extend upward from the plane portion 230P. The partition walls 230W1, 230W2, and 230W3 are spaced apart from each other.

Each of the partition walls 230W1, 230W2, and 230W3 includes a supporting surface at an upper end thereof. The partition walls 230W1, 230W2, and 230W3 extend to allow the supporting surfaces are arranged at the same plane as an upper surface of the second base substrate 220.

As shown in FIG. 5, a display module DM-1 according to the present disclosure further includes a third supporting member 250. The third supporting member 250 is filled in a space between the partition walls 230W1, 230W2, and 230W3. Since the third supporting member 250 is filled in the space between the partition walls 230W1, 230W2, and 230W3, the upper protection member 100U (refer to FIG. 4C) is stably supported.

FIG. 6 is a cross-sectional view showing a portion of a display device according to another exemplary embodiment of the present disclosure. The elements shown in FIG. 6 have the same structure and function as those of the elements shown in FIGS. 1 to 5 except for optical members OP10-1 and OP20-1. In FIG. 6, the same reference numerals denote the same elements in FIGS. 1 to 5, and thus the detailed descriptions of the same elements will be omitted.

In the present exemplary embodiment, a first optical member OP10-1 and a second optical member OP20-1 are overlapped with the first pad area PAD1. Although not shown in figures, the first optical member OP10-1 and the second optical member OP20-1 may overlap with the second pad area PAD2 (refer to FIG. 2).

The second optical member OP20-1 is disposed on a plane surface IP defined by an upper surface of the first optical member 230, an upper surface of the second supporting member 240, and an upper surface of the second base substrate 220. The second optical member OP20-1 may cover the first pad area PAD1.

A display module DM-2 according to the present exemplary embodiment covers the first and second pad areas PAD1 and PAD2 without including an additional upper protection member 100U (refer to FIG. 1). Thus, the thickness and the bezel area of the display device according to the present disclosure may be reduced since elements, such as chassis, covering the upper portion of the display panel, can be eliminated.

FIGS. 7A to 7E are cross-sectional views showing a manufacturing method of a display device according to an exemplary embodiment of the present disclosure. In FIGS. 7A to 7E, the manufacturing method of the display device shown in FIG. 4A is illustrated. In FIGS. 7A to 7E, the same reference numerals denote the same elements in FIGS. 1 to 6, and thus the detailed descriptions of the same elements will be omitted.

Figure 7A:
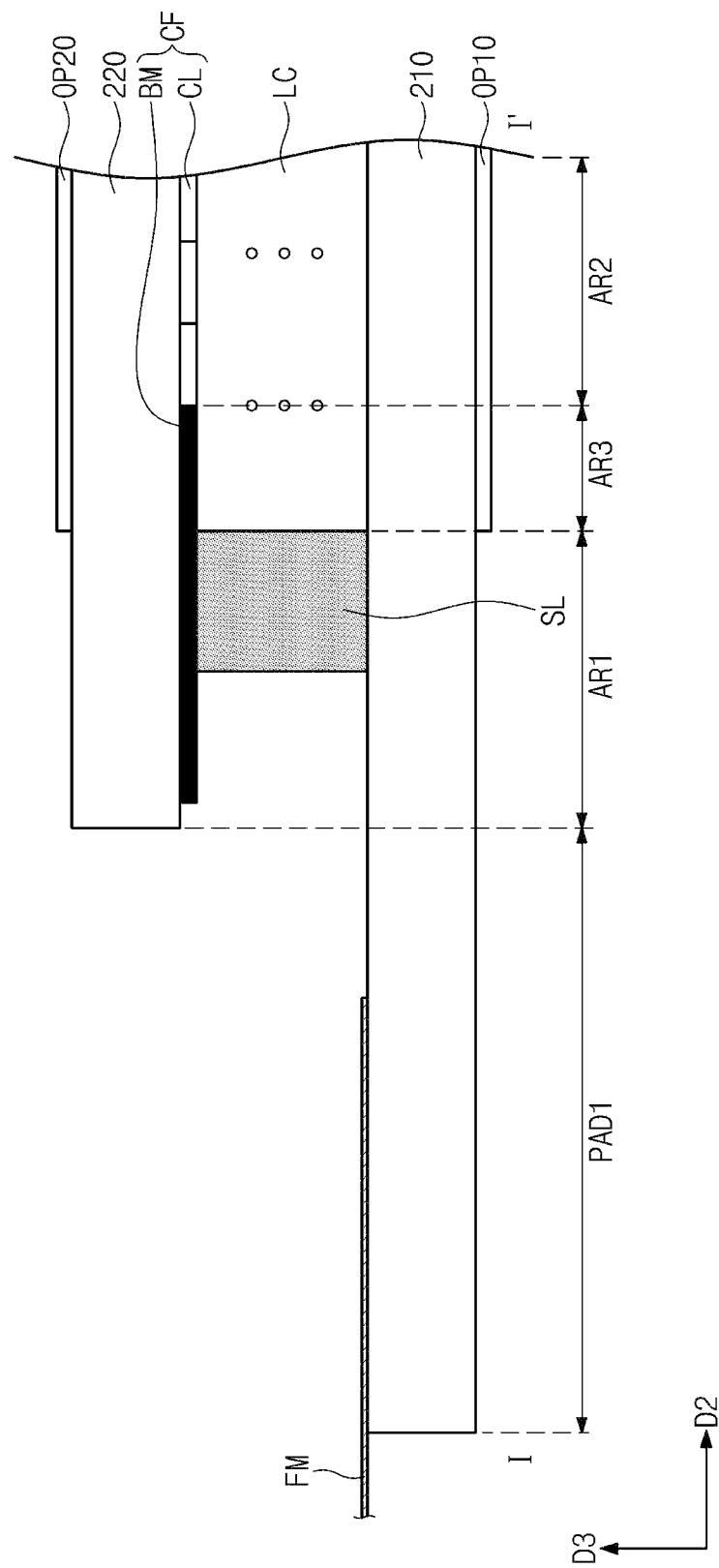

Referring to FIG. 7A, the display panel DP and the driving circuit part are prepared. The display panel DP includes the first base substrate 210, the second base substrate 220 facing the first base substrate 210, and the liquid crystal layer LC interposed between the first and second base substrates 210 and 220.

The driving circuit part is disposed on the first pad area PAD1. The driving circuit part includes the flexible circuit film FM and the printed circuit board (not shown). One end of the flexible circuit film FM is connected to the pad part (not shown) of the first pad area PAD1, and the other end of the flexible circuit film FM is connected to the printed circuit board. A data driving chip (not shown) is disposed on the flexible circuit film FM. The data driving chip is mounted on a lower surface of the flexible circuit film FM by a tape amounted bonding (TAB) process. The printed circuit board and the data driving chip have been omitted in figures.

Figure 7B:
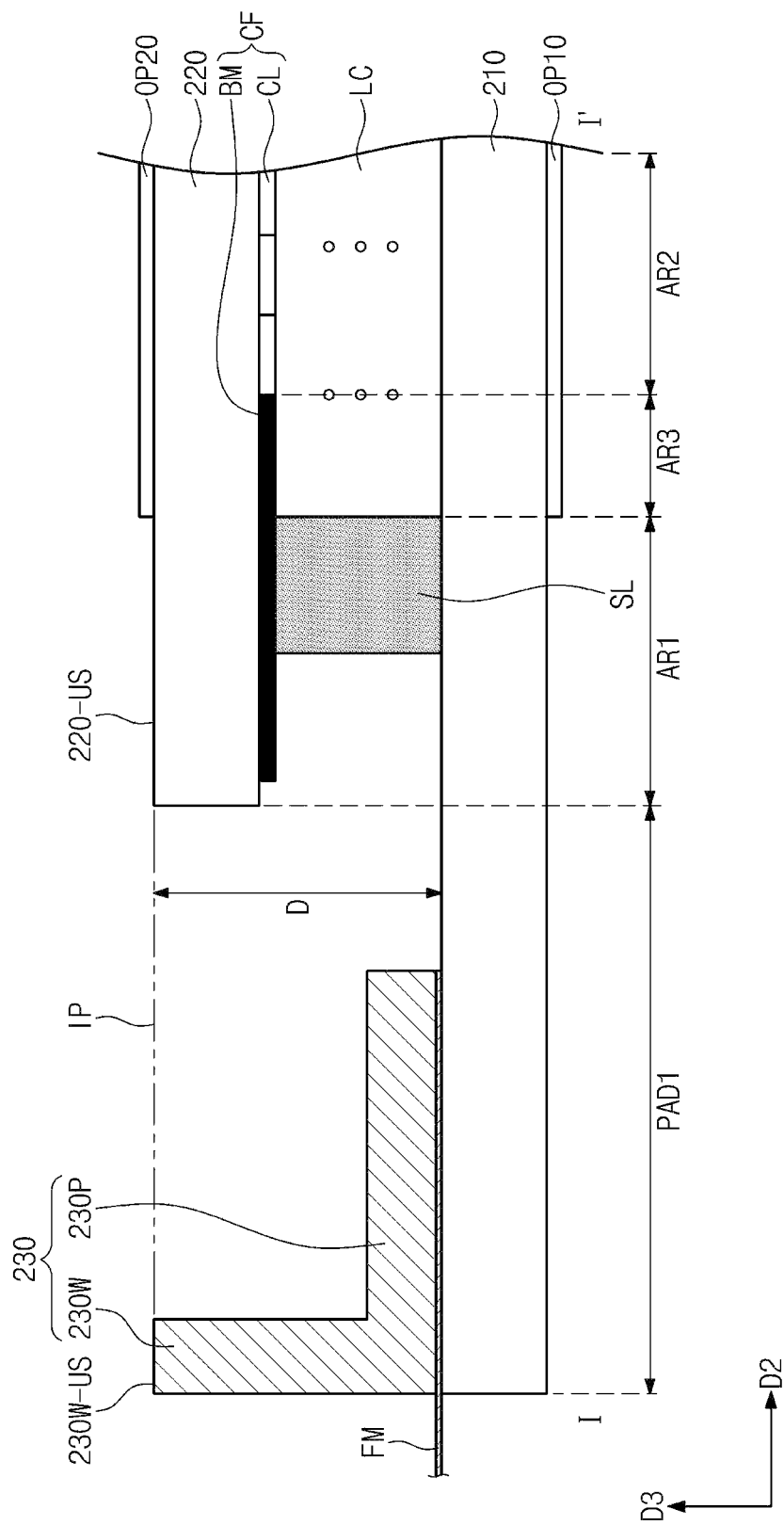

Referring to FIG. 7B, the first supporting member 230 is disposed on the first pad area PAD1. The first supporting member 230 includes the plane portion 230P and the partition wall 230W connected to the plane portion 230P. The partition wall 230W is bent upward from and extends upwardly from the plane portion 230P.

The first supporting member 230 is disposed to allow the plane portion 230P to overlap with the one end of the flexible circuit film FM and the pad part. In addition, the side surface of the partition wall 230W is aligned with the edge portion of the first base substrate 210.

The upper surface 230W-US of the partition wall 230W defines the same plane IP as the upper surface 220-US of the second base substrate 220. The first supporting member 230 has the size corresponding to a step difference D between the upper surface of the first base substrate 210 and the upper surface 220-US of the second base substrate 220.

Referring to FIG. 7C, a heating process and a pressing process HP are performed on the pad area. The driving circuit part disposed on the first pad area PAD1 is electrically coupled to the signal lines disposed on an inner side surface of the first base substrate 210. Although not shown in figures, the conductive adhesive member may be further disposed between the flexible circuit film FM and the pad part (not shown). The conductive adhesive member increases an adhesive force and an electrical connection characteristic between the flexible circuit film FM and the first base substrate 210 and between the flexible circuit film FM and the pad part.

Figure 7D:
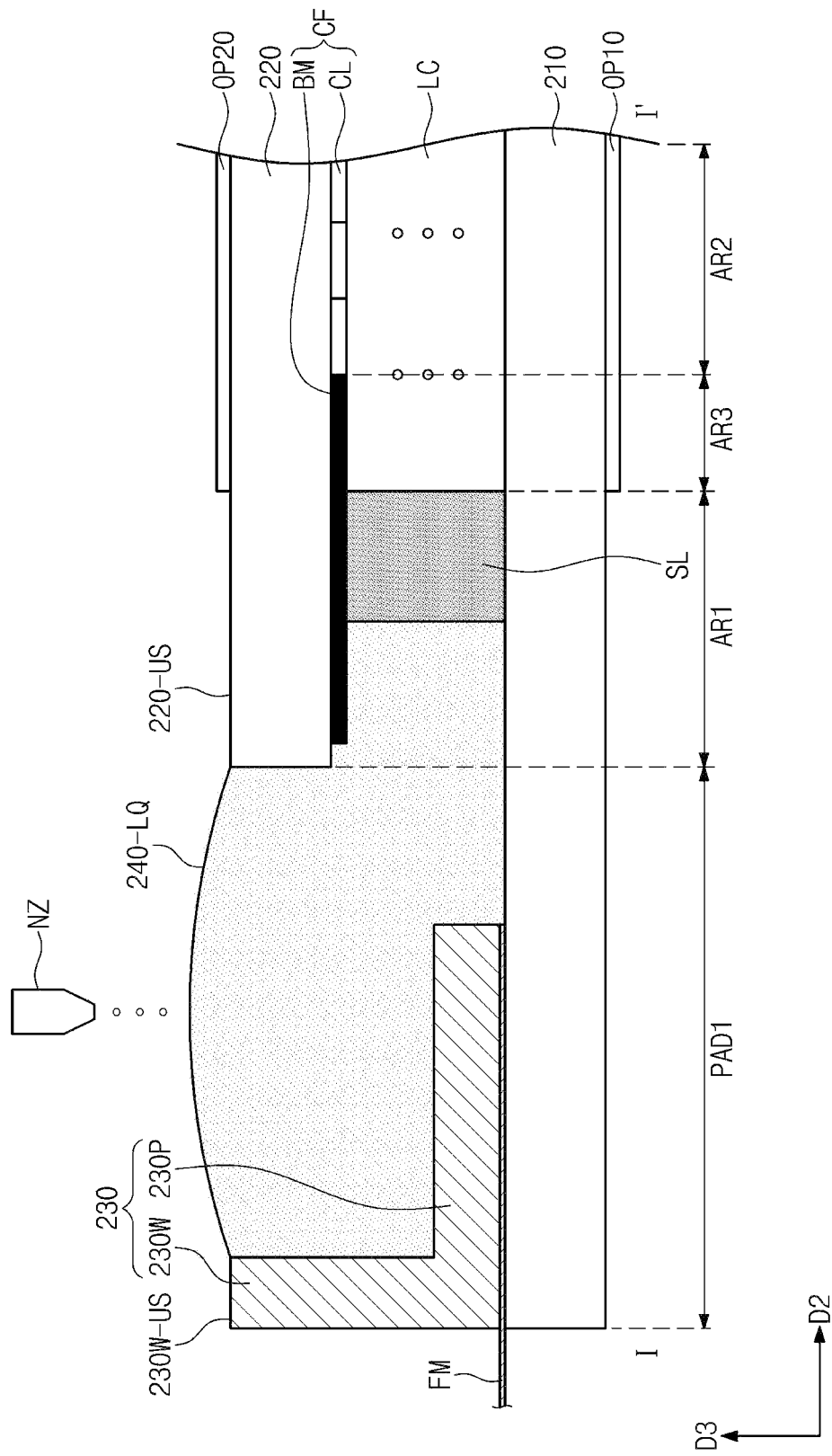

As shown in FIG. 7D, a second supporting member 240-LQ in liquid form is provided on the first pad area PAD1 using a nozzle NZ. The second supporting member 240-LQ in liquid form is filled in the space formed by the first supporting member 230, the sealing member SL, and the side surface of the second base substrate 220.

Figure 7E:
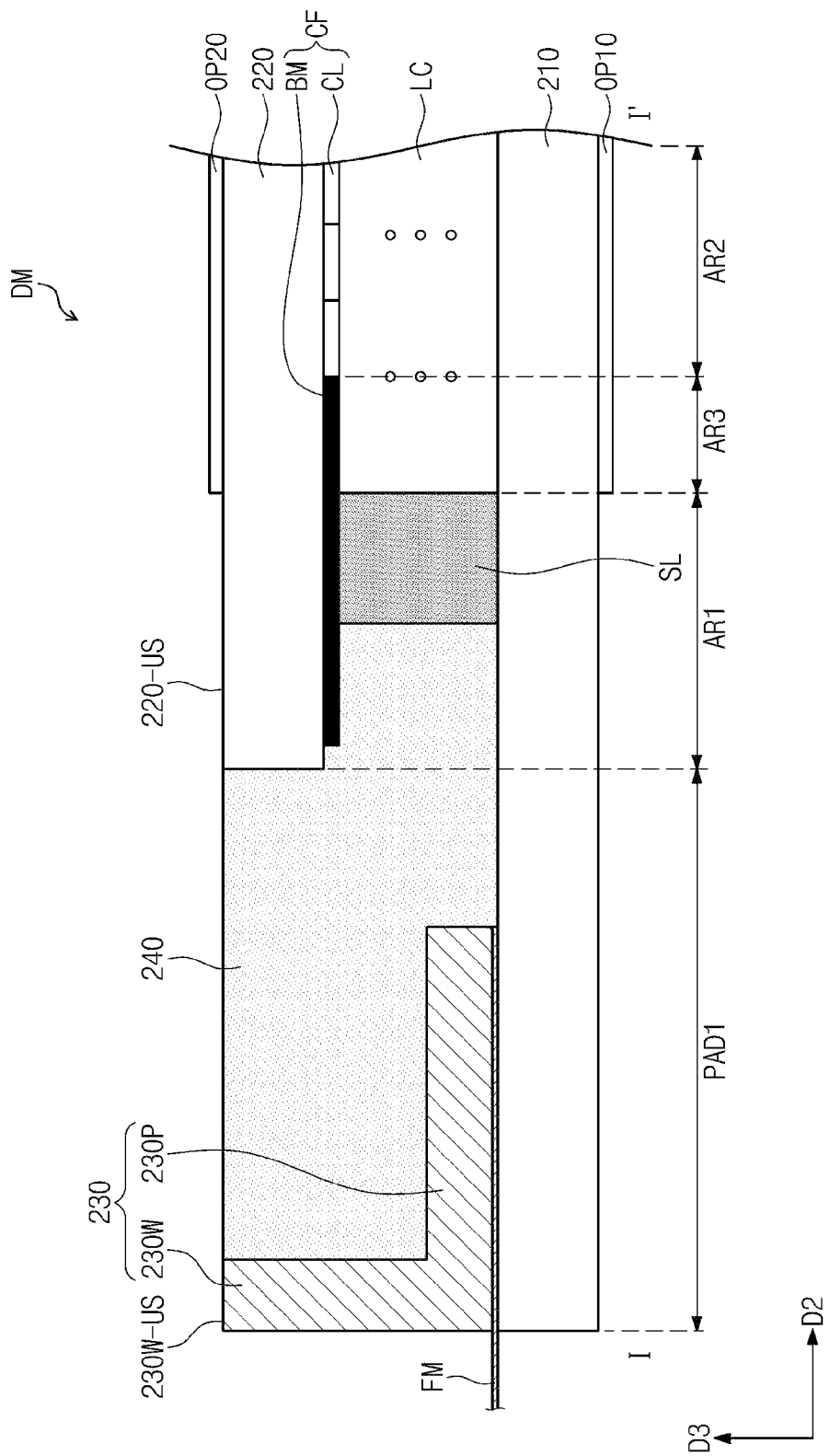

Referring to FIG. 7E, the second supporting member 240-LQ in liquid form is cured to form the second supporting member 240. The second supporting member 240 is cured by heat or light, or the second supporting member 240 is cured by a drying process.

The second supporting member 240 may include silicon. The second supporting member 240 prevents moisture from entering the sealing member SL. The second supporting member 240 complements the function of the sealing member SL. As described, when the moisture preventing property of the second supporting member 240 is improved, the size of the intermediate area AR3 disposed between the pixel area AR2 and the sealing member SL is reduced. Thus, the bezel area of the display device is decreased.

The manufacturing method of the display module DM according to the present exemplary embodiment may further include a grinding process such that the upper surface of the second supporting member 240 and the upper surface 220-US of the second base substrate 220 have the same plane surface. The upper surface 230W-US of the first supporting member 230, the upper surface 240-US of the second supporting member 240, and the upper surface 220-US of the second base substrate 220 may define the same plane surface.

FIGS. 8A to 8E are cross-sectional views showing a manufacturing method of a display device according to another exemplary embodiment of the present disclosure. In FIGS. 8A to 8E, a manufacturing method of a display module DM-2 shown in FIG. 6 is illustrated. In FIGS. 8A to 8E, the same reference numerals denote the same elements in FIGS. 7A to 7E, and thus the detailed descriptions of the same elements will be omitted.

Figure 8A:
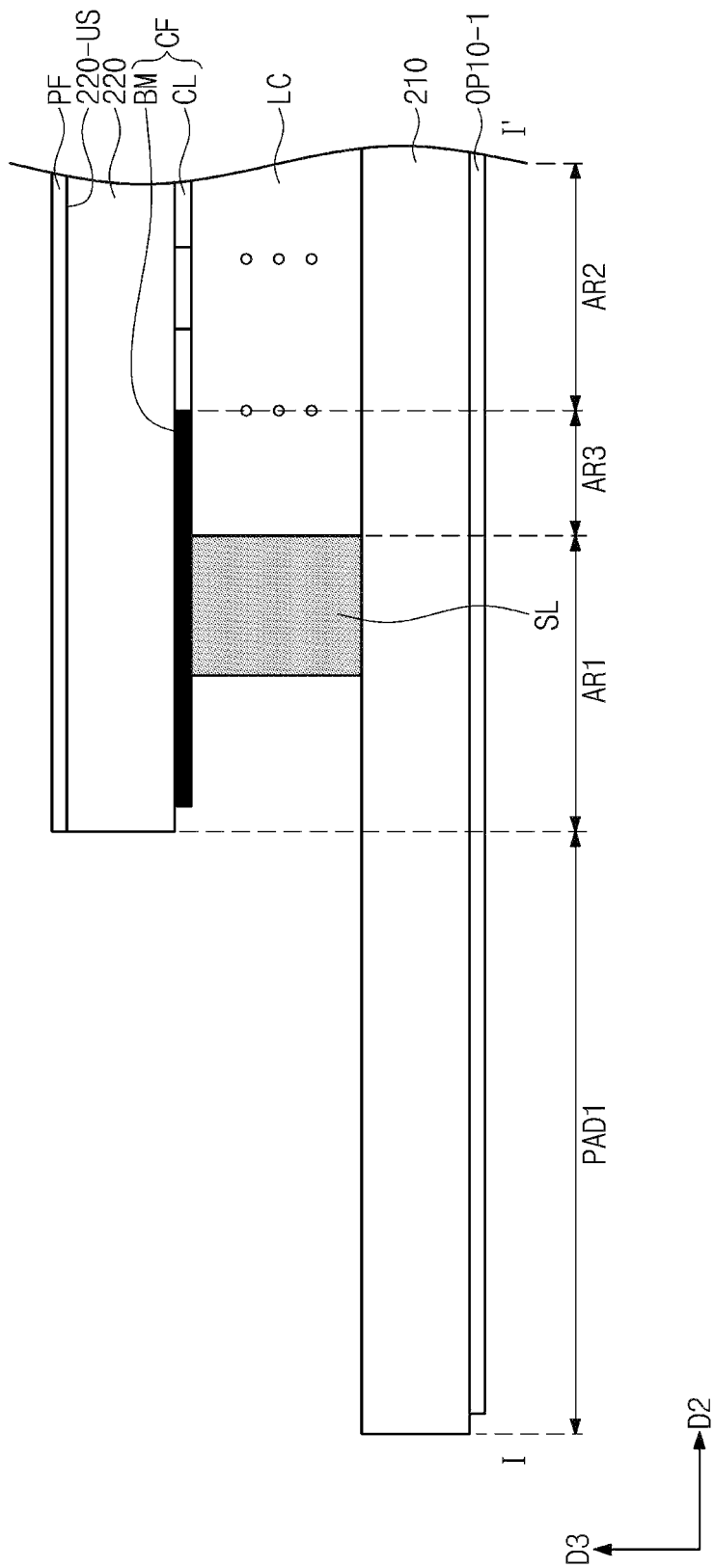

Referring to FIG. 8A, the first base substrate 210 and the second base substrate 220 disposed on the first base substrate 210 are formed. Then, the sealing member SL is formed between the first base substrate 210 and the second base substrate 220, and the first and second base substrates 210 and 220 are sealed together.

The liquid crystal layer LC is formed between the first base substrate 210 and the second base substrate 220. The liquid crystal layer LC is sealed by the sealing member SL. The sealing member SL protects the liquid crystal layer LC from external environments.

A first polarizing member OP10-1 is formed on the outer surface of the first base substrate 210. The first polarizing member OP10-1 covers the entire surface of the first base substrate 210. A protection film PF is attached onto the outer surface of the second base substrate 220. The protection film PF covers the entire surface of the second base substrate 220.

Figure 8C:
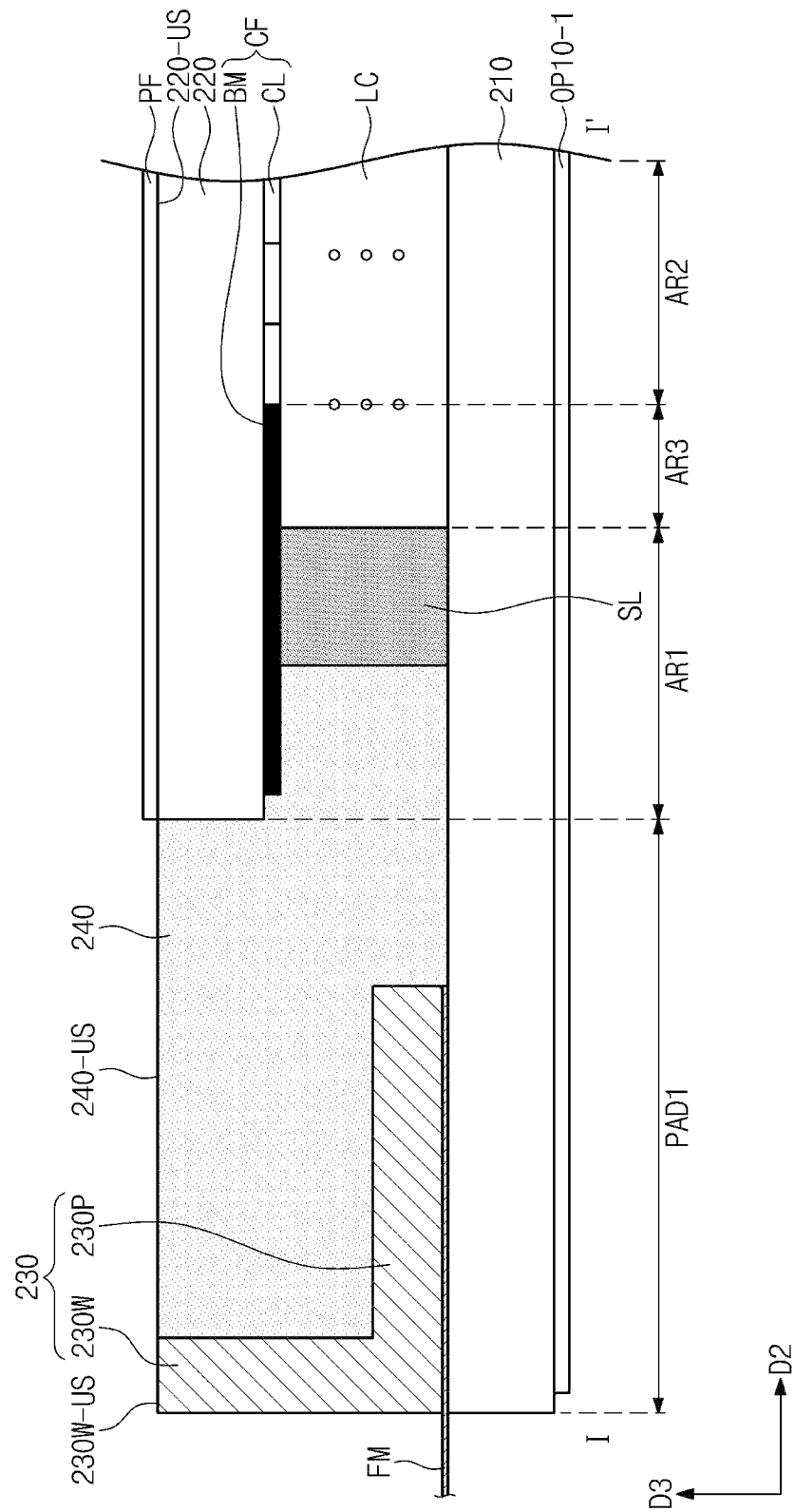

Referring to FIGS. 8B and 8C, the flexible circuit film FM is bonded to the first pad area PAD1 through a heating and pressing process HP. Then, the second supporting member 240 is filled in the first pad area PAD1. The second supporting member 240 is filled in the space formed by the first supporting member 230, the first base substrate 210, the coupling member SL, and the side surface of the second base substrate 220.

Figure 8D:
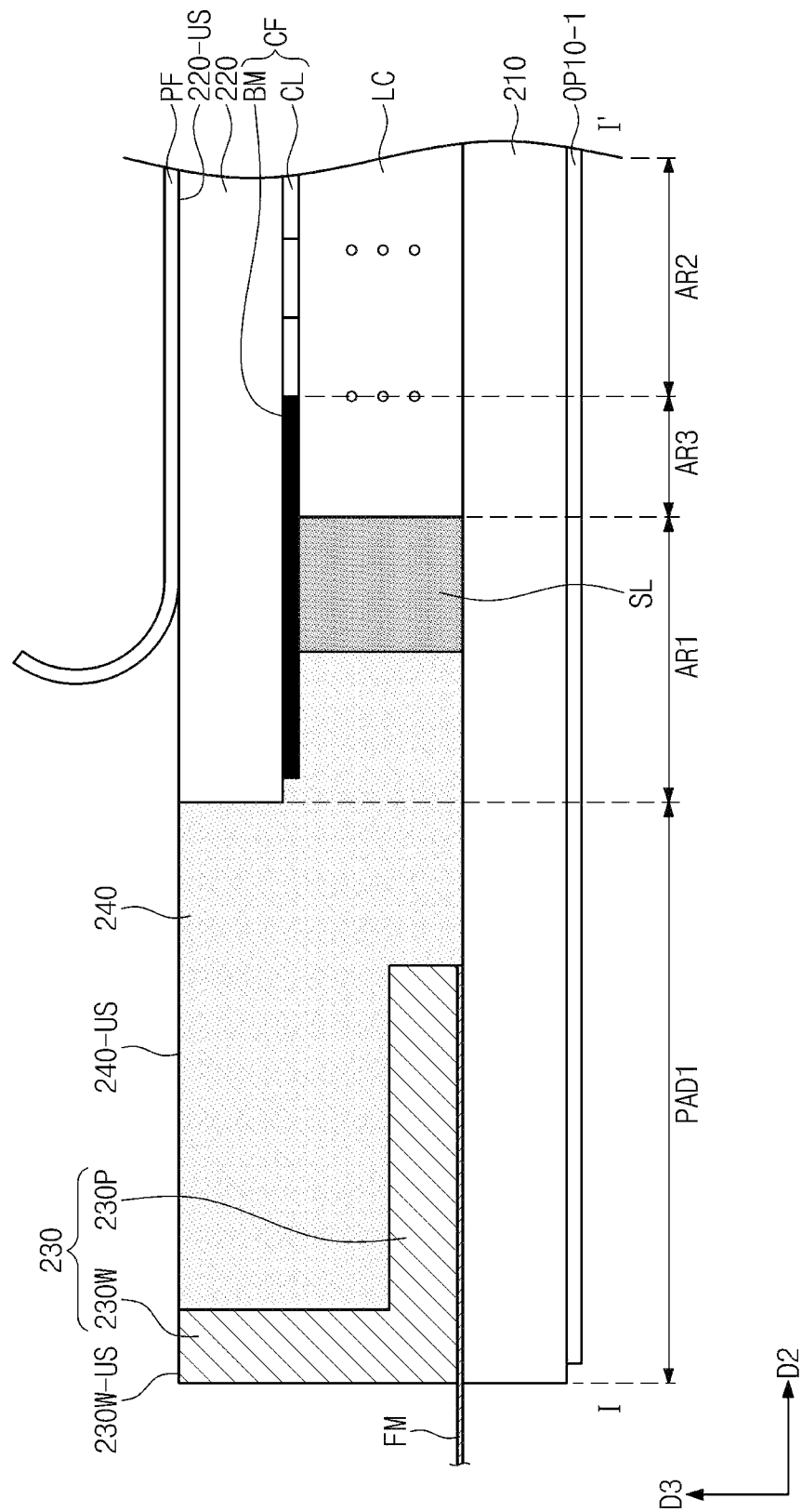

As shown in FIGS. 8D and 8E, after the first supporting member 230 is formed, the protection film PF is removed from the second base substrate 220. A second polarizing member OP20-1 is disposed on the upper portion of the second base substrate 220 from which the protection film PF is removed. The manufacturing method of the display device according to the present exemplary embodiment further includes a process of attaching the protection film PF on the outer surface of the second base substrate 220. Thus, the second polarizing member OP20-1 is prevented from being damaged during the bonding process, and the curing process of the second supporting member 240.

The upper surface 230W-US of the first supporting member 230, the upper surface of the second supporting member 240, and the upper surface 220-US of the second base substrate 220 define the same plane surface IP (refer to FIG. 8B). The second polarizing member OP20-1 is disposed on the plane surface IP. The second polarizing member OP20-1 covers the second base substrate 220 and the first pad area PAD1.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device, comprising:
   a first base substrate including an effective area and a first pad area disposed adjacent to the effective area;
   a first pad part disposed in the first pad area,
   a first driving chip disposed on the first pad part,
   a second base substrate disposed to be spaced apart from the first base substrate, overlapping with the effective area, and exposing the first pad area;
   a sealing member disposed between the first base substrate and the second base substrate;
   a first supporting member disposed in the first pad area of the first base substrate and spaced apart from the sealing member to define a supporting space; and
   a second supporting member filled in the supporting space,
   wherein the first supporting member comprises a plane portion covering the first driving chip, and a partition wall extending upward from an end side of the plane portion to define the supporting space.

2. The display device of claim 1, further comprising:
   a plurality of first signal lines each including a line part disposed in the effective area and the first pad part coupled to the line part and disposed in the first pad area, the first signal lines extending in a first direction; and
   a plurality of second signal lines extending in a second direction substantially perpendicular to the first direction, wherein the first supporting member is disposed on the first pad part of each of the first signal lines.

3. The display device of claim 2, wherein the first base substrate further comprises a second pad area disposed adjacent to the effective area,
   the second signal lines comprise a plurality of line parts disposed in the effective area and a plurality of second pad parts connected to the line parts and disposed in the second pad area, and
   the first supporting member is disposed in each of the first pad area and the second pad area.

4. The display device of claim 2, wherein:
   the first driving chip is electrically coupled to the first pad parts of the first signal lines to apply a voltage to the first pad parts of the first signal lines,
   the first driving chip is disposed to overlap with the first pad parts of the first signal lines in the first pad area, and
   the first supporting member is disposed on the first driving chip.

5. The display device of claim 3, further comprising:
   a flexible circuit film disposed on the second pad parts and electrically coupled to the second pad parts of the second signal lines;
   a second driving chip mounted on the flexible circuit film; and
   a circuit board connected to the flexible circuit film,
   wherein the first supporting member covers the flexible circuit film in the second pad area.

6. The display device of claim 1, wherein the sealing member is disposed along an edge of the second base substrate when viewed in a plan view.

7. The display device of claim 1, wherein an upper surface of the partition wall defines a same plane surface as an upper surface of the second base substrate.

8. The display device of claim 7, wherein an upper surface of the second supporting member defines a substantially same plane surface as the upper surface of the partition wall and the upper surface of the second base substrate.

9. The display device of claim 8, further comprising:
   a first optical member disposed under the first base substrate; and
   a second optical member disposed on the second base substrate, and
   wherein the first optical member and the second optical member overlap with the effective area.

10. The display device of claim 9, wherein the second optical member is disposed on a plane surface defined by the upper surface of the partition wall, the upper surface of the second supporting member, and the upper surface of the second base substrate to cover the first pad area.

11. The display device of claim 8, further comprising:
    a cover member including a sidewall portion that covers an edge of the first base substrate and the partition wall of the first supporting member and an upper portion bent from the sidewall portion to cover the first pad area,
    wherein the upper portion of the cover member is disposed on the plane surface defined by the upper surface of the partition wall, the upper surface of the second supporting member, and the upper surface of the second base substrate.

12. The display device of claim 11, wherein an edge of the upper portion of the cover member overlaps the sealing member.

13. The display device of claim 1, further comprising:
    a third supporting member,
    wherein the partition wall is provided in plural numbers, the partition walls are spaced apart from each other, and the third supporting member is filled between the partition walls.

14. The display device of claim 1, wherein the second supporting member comprises silicon.

15. The display device of claim 14, wherein the second supporting member further comprises a black pigment particle.

16. A method of manufacturing a display device, comprising:
    preparing a display panel including a pad area;
    disposing a driving circuit part in the pad area of the display panel;
    disposing a first supporting member on the driving circuit part, the first supporting member comprising a plane portion covering the driving circuit part, and a partition wall extending upward from end side of the plane portion to define a supporting space;
    bonding the driving circuit part to the display panel;
    filling a second supporting member in the supporting space; and
    curing the second supporting member by light or heat.

17. The method of claim 16, further comprising:
    grinding an upper surface of the second supporting member so that the upper surface of the second supporting member has a substantially same plane surface as an upper surface of the display panel.

18. A method of manufacturing a display device, comprising:
    preparing a display panel including an effective area and a pad area at least one side of the effective area;
    attaching a first optical member on a lower surface of the display panel, the first optical member overlapping with both of the effective area and the pad area;
    attaching a protection film on an upper surface of the display panel, the protection film overlapping with the effective area and exposing the pad area;

disposing a flexible circuit film in the pad area of the display panel;
disposing a first supporting member on the flexible circuit film, the first supporting member comprising a plane portion covering the flexible circuit film, and a partition wall extending upward from end side of the plane portion to define a supporting space;
bonding the flexible circuit film to the display panel;
filling a second supporting member in the supporting space;
curing the second supporting member by light or heat; and
removing the protection film from the upper surface of the display panel; and bonding a second optical member on the upper surface of the display panel to cover the pad area,
wherein the second optical member overlaps both of the effective area and the pad area.

* * * * *